(12) United States Patent
Jannard et al.

(10) Patent No.: US 7,150,526 B2
(45) Date of Patent: Dec. 19, 2006

(54) WIRELESS INTERACTIVE HEADSET

(75) Inventors: James Jannard, Eastsound, WA (US); Davin Saderholm, Mission Viejo, CA (US); Carlos Reyes, Rancho Santa Margarita, CA (US); Colin Baden, Irvine, CA (US); Sumner Lane Bruns, Annapolis, MD (US)

(73) Assignee: Oakley, Inc., Foothill Ranch, CA (US)

( * ) Notice: Subject to any disclaimer, the term of this patent is extended or adjusted under 35 U.S.C. 154(b) by 0 days.

(21) Appl. No.: 10/628,831

(22) Filed: Jul. 28, 2003

(65) Prior Publication Data

US 2004/0160573 A1 Aug. 19, 2004

Related U.S. Application Data

(63) Continuation-in-part of application No. 10/004,543, filed on Dec. 4, 2001, which is a continuation of application No. 09/585,593, filed on Jun. 2, 2000, now Pat. No. 6,325,507.

(60) Provisional application No. 60/460,154, filed on Apr. 3, 2003, provisional application No. 60/399,317, filed on Jul. 26, 2002.

(51) Int. Cl.
*G02C 1/00* (2006.01)
(52) U.S. Cl. .......................... 351/158; 351/41
(58) Field of Classification Search ................. 351/158, 351/41, 123; 455/343, 344, 347, 350, 351; 704/225
See application file for complete search history.

(56) References Cited

U.S. PATENT DOCUMENTS

| 1,026,272 A | 5/1912 | Leveque |
| 1,370,806 A | 3/1921 | Gamer |
| 2,424,935 A | 7/1947 | Kimmel |
| 2,504,524 A | 4/1950 | Hayward |
| 2,688,900 A | 9/1954 | Silverman |
| 3,104,290 A | 2/1957 | Rosemond et al. |
| 2,856,466 A | 10/1958 | Gustafson et al. |
| 2,882,348 A | 4/1959 | Erickson |
| 2,947,822 A | 8/1960 | Matsuura |
| 2,999,136 A | 9/1961 | Holt et al. |
| 3,119,903 A | 1/1964 | Rosemond et al. |
| 3,247,330 A | 4/1966 | Hinman |
| D207,919 S | 6/1967 | Lui Fai |
| 3,371,979 A | 3/1968 | Catanzaro |
| D212,863 S | 12/1968 | Roberts |
| 3,588,384 A | 6/1971 | Negley |
| 3,665,122 A | 5/1972 | Weiss |

(Continued)

FOREIGN PATENT DOCUMENTS

IT 00235504 4/2000

OTHER PUBLICATIONS

Motorola Bluetooth Wireless Headset User Guide.
Motorola Consumer Catalog for Phone Accessories from "www.commerce.motorola.com", web site visited on Jun. 13, 2002.

(Continued)

*Primary Examiner*—Hung Xuan Dang
(74) *Attorney, Agent, or Firm*—Knobbe, Martens, Olson & Bear, LLP

(57) ABSTRACT

A wearable audio interface includes a support for positioning the plurality of speakers juxtaposed to and spaced from the ears of a wearer. The audio device can include wireless networking electronics so as to allow the device to interact with other wireless network devices.

28 Claims, 28 Drawing Sheets

U.S. PATENT DOCUMENTS

| | | | |
|---|---|---|---|
| 3,809,829 A | 5/1974 | Vignini et al. | |
| 3,853,393 A | 12/1974 | Fila et al. | |
| 3,883,701 A | 5/1975 | Delorenzo | |
| 4,149,780 A | 4/1979 | Young | |
| 4,537,612 A | 8/1985 | Borrelli et al. | |
| 4,550,984 A | 11/1985 | Reymond | |
| 4,683,587 A | 7/1987 | Silverman | |
| 4,712,244 A | 12/1987 | Zwicker | |
| 4,773,095 A | 9/1988 | Zwicker | |
| 4,803,487 A | 2/1989 | Willard et al. | |
| 4,806,011 A | 2/1989 | Bettinger | |
| 4,856,086 A | 8/1989 | McCullough | |
| 4,882,769 A | 11/1989 | Gallimore | |
| 4,902,120 A | 2/1990 | Weyer | |
| 4,904,078 A | 2/1990 | Gorike | |
| 5,020,150 A | 5/1991 | Shannon | |
| 5,029,216 A | 7/1991 | Jhabvala | |
| 5,137,342 A | 8/1992 | Jannard et al. | |
| 5,159,639 A | 10/1992 | Shannon et al. | |
| 5,249,001 A | 9/1993 | Jannard | |
| 5,281,957 A | 1/1994 | Schoolman | |
| 5,327,178 A * | 7/1994 | McManigal | 351/158 |
| 5,335,285 A | 8/1994 | Gluz | |
| 5,353,378 A | 10/1994 | Hoffman et al. | |
| 5,367,345 A | 11/1994 | Da Silva | |
| 5,404,385 A | 4/1995 | Ben-Haim | |
| RE35,051 E | 10/1995 | Moore | |
| 5,533,130 A | 7/1996 | Staton | |
| 5,563,951 A | 10/1996 | Wang et al. | |
| 5,579,400 A | 11/1996 | Ballein | |
| 5,581,492 A | 12/1996 | Janik | |
| 5,606,743 A | 2/1997 | Vogt et al. | |
| 5,608,808 A | 3/1997 | Da Silva | |
| 5,613,222 A | 3/1997 | Guenther | |
| 5,617,477 A | 4/1997 | Boyden | |
| 5,634,201 A | 5/1997 | Mooring | |
| 5,654,786 A | 8/1997 | Bylander | |
| 5,658,502 A | 8/1997 | Hughes | |
| 5,680,465 A | 10/1997 | Boyden | |
| 5,682,434 A | 10/1997 | Boyden | |
| 5,694,475 A | 12/1997 | Boyden | |
| 5,708,724 A | 1/1998 | Burris et al. | |
| 5,715,323 A | 2/1998 | Walker | |
| 5,717,479 A | 2/1998 | Rickards | |
| 5,721,783 A | 2/1998 | Anderson | |
| 5,737,436 A | 4/1998 | Boyden | |
| 5,757,929 A | 5/1998 | Wang et al. | |
| 5,781,272 A | 7/1998 | Bright et al. | |
| 5,796,341 A | 8/1998 | Stratiotis | |
| 5,805,261 A | 9/1998 | Houston et al. | |
| 5,835,185 A | 11/1998 | Kallman et al. | |
| 5,853,005 A | 12/1998 | Scanlon | |
| 5,886,822 A | 3/1999 | Spitzer | |
| 5,889,843 A | 3/1999 | Singer et al. | |
| 5,892,564 A | 4/1999 | Rahn | |
| 5,953,000 A | 9/1999 | Weirich | |
| 5,953,434 A | 9/1999 | Boyden | |
| 5,988,812 A | 11/1999 | Wingate | |
| D418,153 S | 12/1999 | Haney | |
| 6,010,216 A | 1/2000 | Jesiek | |
| 6,012,812 A * | 1/2000 | Rickards | 351/158 |
| 6,057,966 A | 5/2000 | Carroll et al. | |
| D426,845 S | 6/2000 | Green et al. | |
| 6,091,546 A | 7/2000 | Spitzer | |
| 6,091,832 A | 7/2000 | Shurman et al. | |
| D430,145 S | 8/2000 | Boyden et al. | |
| 6,106,116 A | 8/2000 | Houston et al. | |
| 6,108,197 A | 8/2000 | Janik | |
| 6,126,595 A | 10/2000 | Amano et al. | |
| D435,058 S | 12/2000 | Green et al. | |
| 6,157,533 A | 12/2000 | Sallam et al. | |
| 6,176,576 B1 | 1/2001 | Green et al. | |
| 6,181,956 B1 | 1/2001 | Koskan | |
| 6,192,253 B1 | 2/2001 | Charlier et al. | |
| 6,204,974 B1 | 3/2001 | Spitzer | |
| 6,211,799 B1 | 4/2001 | Post et al. | |
| 6,212,414 B1 | 4/2001 | Alameh et al. | |
| 6,218,958 B1 | 4/2001 | Eichstaedt et al. | |
| 6,230,327 B1 | 5/2001 | Briand et al. | |
| 6,231,181 B1 | 5/2001 | Swab | |
| 6,233,344 B1 | 5/2001 | Clegg et al. | |
| 6,233,345 B1 | 5/2001 | Urwyler | |
| 6,239,778 B1 | 5/2001 | Palffy-Muhoray et al. | |
| 6,252,970 B1 | 6/2001 | Poon et al. | |
| D445,416 S | 7/2001 | Glezerman | |
| 6,272,359 B1 | 8/2001 | Kivela et al. | |
| 6,280,838 B1 | 8/2001 | Bernards et al. | |
| 6,285,757 B1 | 9/2001 | Carroll et al. | |
| 6,301,050 B1 | 10/2001 | DeLeon | |
| 6,301,367 B1 | 10/2001 | Boyden et al. | |
| 6,301,593 B1 | 10/2001 | Toyosato | |
| 6,311,155 B1 * | 10/2001 | Vaudrey et al. | 704/225 |
| 6,312,811 B1 | 11/2001 | Frigoli et al. | |
| 6,314,091 B1 | 11/2001 | LaRowe, Jr. et al. | |
| 6,325,507 B1 | 12/2001 | Jannard et al. | |
| 6,347,095 B1 | 2/2002 | Tang et al. | |
| 6,349,001 B1 | 2/2002 | Spitzer | |
| 6,350,129 B1 | 2/2002 | Gorlick | |
| 6,351,468 B1 | 2/2002 | LaRowe, Jr. et al. | |
| 6,356,392 B1 | 3/2002 | Spitzer | |
| 6,384,982 B1 | 5/2002 | Spitzer | |
| 6,392,798 B1 | 5/2002 | Newkirk | |
| 6,409,338 B1 | 6/2002 | Jewell | |
| 6,421,031 B1 | 7/2002 | Ronzani et al. | |
| D462,708 S | 9/2002 | Miller et al. | |
| D462,946 S | 9/2002 | Beraut et al. | |
| 6,456,721 B1 | 9/2002 | Fukuda | |
| 6,490,362 B1 | 12/2002 | Clegg et al. | |
| 6,510,325 B1 | 1/2003 | Mack, II et al. | |
| 6,519,475 B1 | 2/2003 | Kim | |
| 6,523,006 B1 | 2/2003 | Ellis et al. | |
| 6,529,804 B1 | 3/2003 | Draggon et al. | |
| 6,549,122 B1 | 4/2003 | Depta | |
| 6,560,449 B1 | 5/2003 | Liu | |
| 6,564,047 B1 | 5/2003 | Steele et al. | |
| 6,567,651 B1 | 5/2003 | Whitley | |
| 6,580,405 B1 | 6/2003 | Yamazaki et al. | |
| 6,582,075 B1 | 6/2003 | Swab et al. | |
| 6,618,099 B1 | 9/2003 | Spitzer | |
| 6,629,076 B1 | 9/2003 | Haken | |
| 6,639,706 B1 | 10/2003 | Ziv et al. | |
| 6,687,486 B1 | 2/2004 | Grzeczkowski | |
| 6,690,807 B1 | 2/2004 | Meyer | |
| 6,691,028 B1 | 2/2004 | Bullock et al. | |
| 6,717,533 B1 | 4/2004 | Seaberg et al. | |
| 6,724,354 B1 | 4/2004 | Spitzer et al. | |
| 6,725,022 B1 | 4/2004 | Clayton et al. | |
| 6,728,531 B1 | 4/2004 | Lee et al. | |
| 6,729,726 B1 | 5/2004 | Miller et al. | |
| 6,735,435 B1 | 5/2004 | Newell et al. | |
| 6,763,119 B1 | 7/2004 | Lee | |
| 6,766,182 B1 | 7/2004 | Janninck et al. | |
| 6,769,767 B1 | 8/2004 | Swab et al. | |
| 6,929,365 B1 | 8/2005 | Swab et al. | |
| 6,966,647 B1 | 11/2005 | Jannard et al. | |
| 7,004,582 B1 | 2/2006 | Jannard et al. | |
| 2002/0098877 A1 | 7/2002 | Glezerman | |
| 2002/0118825 A1 | 8/2002 | Mitra | |
| 2002/0159023 A1 | 10/2002 | Swab | |
| 2002/0176330 A1 | 11/2002 | Ramonowski et al. | |
| 2002/0197961 A1 | 12/2002 | Warren | |
| 2003/0003969 A1 | 1/2003 | Tong et al. | |
| 2003/0022690 A1 | 1/2003 | Beyda et al. | |
| 2003/0067585 A1 | 4/2003 | Miller et al. | |

| | | |
|---|---|---|
| 2003/0068057 A1 | 4/2003 | Miller et al. |
| 2003/0073460 A1 | 4/2003 | Van Pelt et al. |
| 2004/0000733 A1 | 1/2004 | Swab et al. |
| 2004/0029582 A1 | 2/2004 | Swab et al. |
| 2004/0156012 A1 | 8/2004 | Jannard et al. |
| 2004/0157649 A1 | 8/2004 | Jannard et al. |
| 2004/0160572 A1 | 8/2004 | Jannard et al. |
| 2004/0239874 A1 | 12/2004 | Swab et al. |
| 2005/0046789 A1 | 3/2005 | Jannard et al. |
| 2005/0046790 A1 | 3/2005 | Jannard et al. |
| 2005/0128431 A1 | 6/2005 | Jannard et al. |
| 2005/0185815 A1 | 8/2005 | Rickards |
| 2005/0201585 A1 | 9/2005 | Jannard et al. |

OTHER PUBLICATIONS

Hands-Free Profile (HFP).

Headset Profile from Bluetooth Specification Version 1.1, Feb. 22, 2001, pp. 198-224.

How Bluetooth Works from "www.howstuffworks.com", web site visited on Jun. 11, 2002.

Special Product Review "ID Magazine", Aug. 2002, p. 179.

"Substance and Style" by Motorola and Frog Design, Motorola. *Time* Nov. 17, 2003.

* cited by examiner

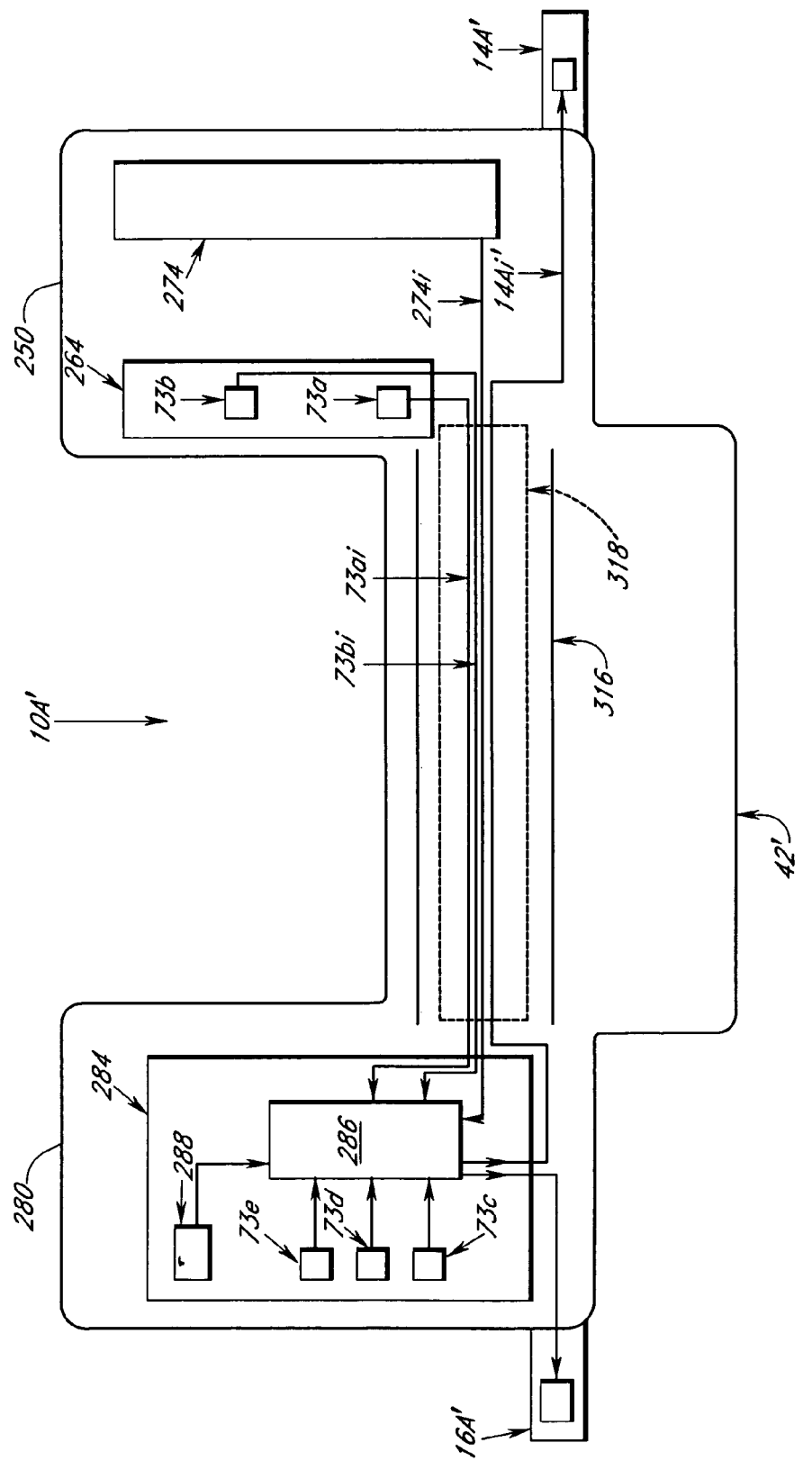

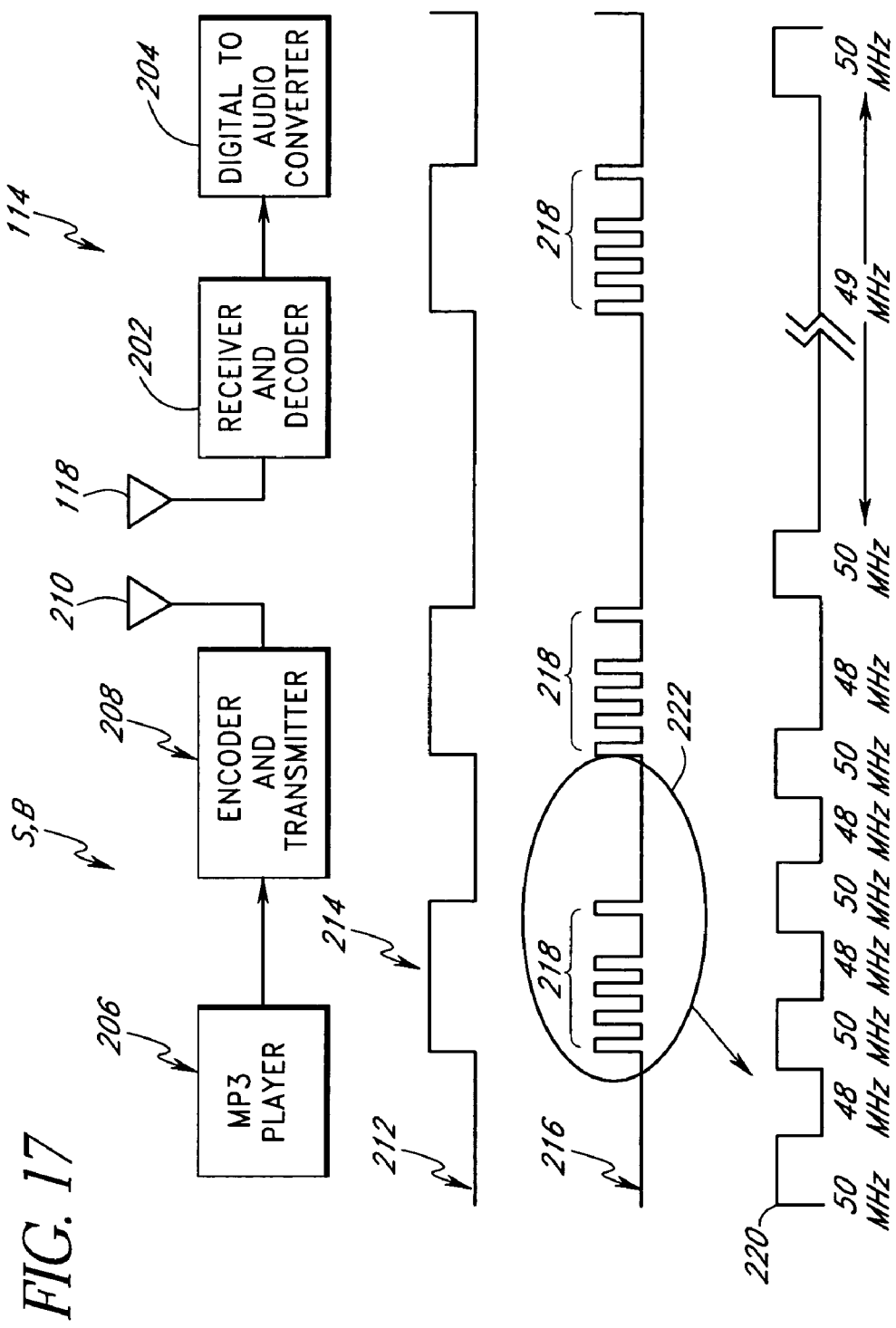

WIRELESS INTERACTIVE HEADSET

REFERENCE TO RELATED APPLICATIONS

The present application is a continuation-in-part of U.S. patent application Ser. No. 10/004,543, filed Dec. 4, 2001, pending, which is a continuation of U.S. patent application Ser. No. 09/585,593, filed Jun. 2, 2000, U.S. Pat. No. 6,325,507, and the present application claims priority benefit under 35 U.S.C. § 120 to the same. Moreover, the present application claims priority benefit under 35 U.S.C. § 119(e) from U.S. Provisional Application Nos. 60/399,317, filed Jul. 26, 2002 and 60/460,154, filed Apr. 3, 2003. The present application incorporates all of the foregoing disclosures herein by reference.

BACKGROUND OF THE INVENTION

1. Field of the Invention

The present invention is directed to wearable audio devices, and in particular, devices that humans can wear on their head and which include audio electronics such as, for example, speakers, microphones, and/or interface electronics for interacting with a wireless network.

2. Description of the Related Art

There are numerous situations in which it is convenient and preferable to mount audio output devices so that they can be worn on the head of a user. Such devices can be used for portable entertainment, personal communications, and the like. For example, these devices could be used in conjunction with cellular telephones, cordless telephones, radios, tape players, MP3 players, portable video systems, hand-held computers and laptop computers.

The audio output for many of these systems is typically directed to the wearer through the use of transducers physically positioned in or covering the ear, such as earphones and headphones. Earphones and headphones, however, are often uncomfortable to use for long periods of time.

In the cell phone industry, certain devices for remote use of a cell phone have become more popular. Certain companies have begun to widely distribute headsets for cell phones which allow a user to interact with the cell phone remotely. For example, a user can wear a headset having an earphone and a microphone connected by a flexible cable to a wireless transceiver which can be worn on the belt, for example. The transceiver communicates wirelessly with a cell phone. Thus, the user can interact with a cell phone without having the cell phone held against their head. However, with such headsets, whenever a user wants to use the cell phone, they must reattach the headphone to their ear. Further, because the headphone is supported only by one ear, it imparts an unbalanced load on the head of the user. Such an unbalanced load, when applied for a long period of time, can cause muscular pain and/or headaches.

SUMMARY OF THE INVENTION

In accordance with one embodiment of at least one of the inventions disclosed herein, a wearable wireless audio interface comprises a support. The support is configured to support at least one lens in a wearer's field of view. The support also comprises a first ear stem and an orbital. A first earphone is supported by the support, directed toward at least one of the wearer's ears, and configured to convert at least one received telecommunication signal into sound. A first electronics device is supported by the support and configured to receive the received telecommunication signal. A microphone is supported by the support and configured to convert the wearer's voice into at least one transmitted telecommunication signal. A second electronics device is supported by the support and configured to transmit the transmitted telecommunication signal.

In accordance with another embodiment of at least one of the inventions disclosed herein, an audio interface system comprises an eyeglass frame, receiver electronics supported by the eyeglass frame and configured to wirelessly receive information. The system also comprises source electronics electrically coupled with the receiver electronics and configured to wirelessly transmit information to the receiver electronics. The eyeglass frame comprises at least one earphone directed toward a wearer's ear. In one implementation, the source electronics are configured to wirelessly receive the information that the source electronics transmits to the receiver electronics. In a further implementation, the source electronics comprises a satellite. In a further implementation, the satellite comprises a source of global positioning to determine the position of the wearer. In another implementation, the source electronics comprises a source of music. In a further implementation, the source electronics comprises an MP3 player. In another implementation, the receiver electronics is configured to receive telecommunications information.

In accordance with another embodiment of at least one of the inventions disclosed herein, an eyeglass frame comprises a support for supporting at least one lens in the path of a wearer's field of view, a first ear stem attached to the support, a second ear stem attached to the support, and at least one microphone supported by at least one of the support, first ear stem, and second ear stem. The microphone is advantageously arranged to face towards the head of a wearer of the eyeglass frame. In one implementation of the invention, the support comprises a pair of orbitals that supports the at least one lens and a second lens, respectively, and a bridge connecting the orbitals. The microphone is advantageously supported by the bridge. In another implementation of the invention, a power supply is replaceably carried by the support.

In accordance with yet another embodiment of at least one of the inventions disclosed herein, an eyeglass comprises a frame configured to support a lens in the path of the wearer's field of view, a telecommunications receiver positioned inside of the frame, a telecommunications transmitter positioned inside of the frame, a first earphone carried by the first earphone support, and a microphone carried by the frame. The frame preferably comprises at least one orbital and a first earphone support. In one implementation of the invention, the eyeglass further comprises a digital storage device. In a further implementation, the digital storage device comprises an MP3 storage device. In one implementation, the eyeglass further comprises a power supply carried by the frame. In one implementation, the power supply is advantageously rechargeable. In one implementation, the power supply is replaceably carried by the frame. In another implementation, the frame further comprises a second earphone and a second earphone support. The second earphone is preferably carried by the second earphone support. In one implementation, the first earphone support extends rearwardly from the front of the eyeglass and second earphone support extends rearwardly from the front of the eyeglass. In one implementation, the first earphone support extends down from the frame and second earphone support extends down from the frame.

An aspect of at least one of the inventions disclosed herein includes the realization that where interactive electronics, such as audio and/or video devices, are incorporated into eyeglasses, it is more important that a user can comfortably and continuously wear such eyeglasses as compared to non-interactive eyeglasses. For example, eyeglasses that have interactive devices, such as, for example, but without limitation, telephonic, video, computers, etc, will have a retail price that is substantially greater than that of non-interactive eyeglasses. Additionally, an advantage of such eyeglasses is that the user can remain highly mobile while utilizing the interactive devices in the eyeglasses. For example, a user could drive an automobile while talking to another person through telephonic devices carried by the eyeglasses. Of course, the user can encounter different lighting conditions when deriving, including bright and low-light conditions. Thus, the eyeglasses are more useful if they can be used in a variety of environments, i.e., different light levels.

In accordance with another embodiment of at least one invention disclosed herein, an eyeglass includes a frame, at least one interactive electronic device supported by the frame, and at least one lens configured to have variable light attenuation.

Further features and advantages of the present invention will become apparent to those of skill in the art in view of the detailed description of preferred embodiments which follows, when considered together with the attached drawings and claims.

BRIEF DESCRIPTION OF THE DRAWINGS

FIG. 3I is a top plan view of the wearable audio device illustrated in FIG. 3D.

FIG. 3M is a schematic illustration of the audio device illustrated in FIG. 3D.

FIG. 17 is a schematic illustration of communication hardware which can be incorporated into any of the wearable audio device as illustrated in FIGS. 1–16 and the communication hardware of another device.

FIG. 18 is a schematic representation showing three output signals, the uppermost signal being the output of a source device, and the lower signals being the representation of the output of an encoder/decoder device illustrated in FIG. 17.

DETAILED DESCRIPTION OF THE PREFERRED EMBODIMENT

Figure 1:
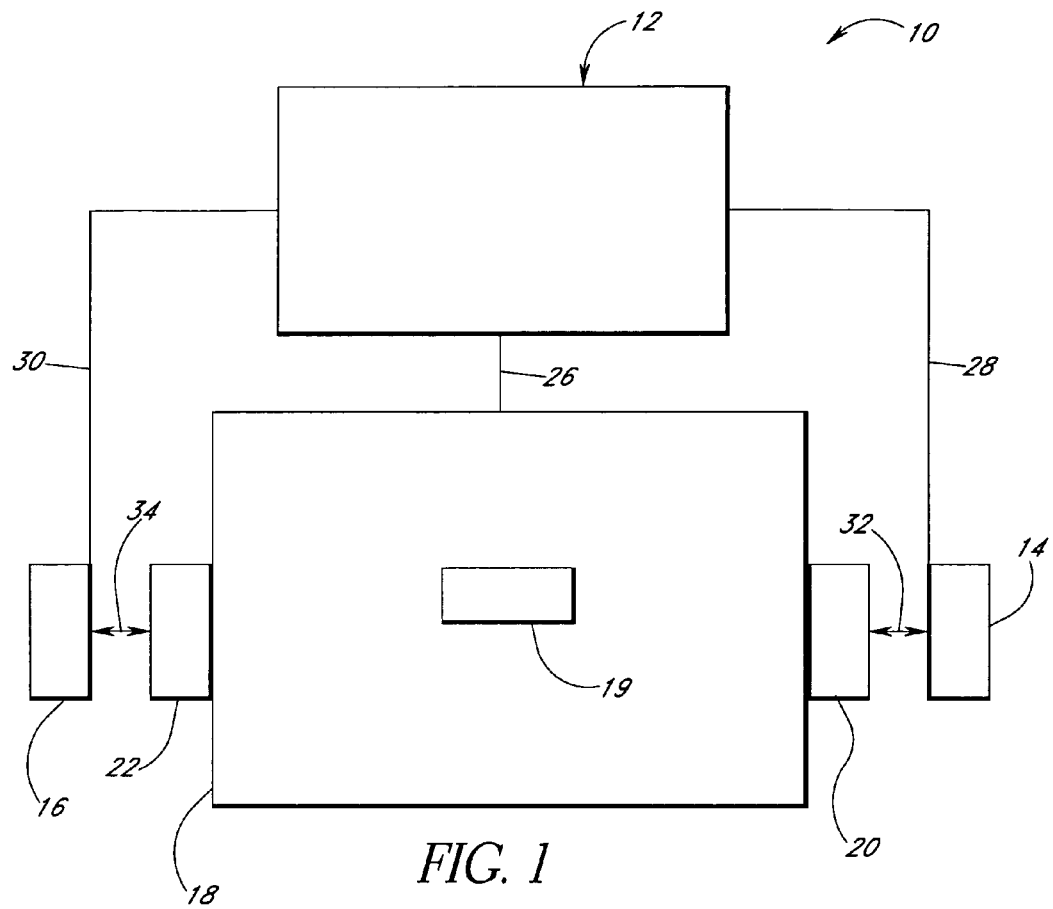
FIG. 1 is a schematic representation of a front elevational view of a wearable audio device supported by a human head.
Figure 2:
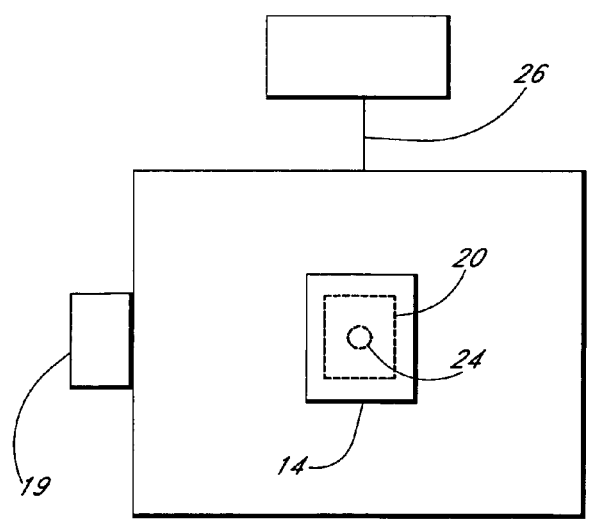
FIG. 2 is a left side elevational view of the audio device illustrated in FIG. 1.

With reference to FIGS. 1 and 2, an audio device 10 includes a support 12 and left and right speakers 14, 16.

The audio device 12 is illustrated as being supported on the head 18 of a human. The head 18 includes a nose 19, and left and right ears 20, 22. The schematic representation of human ears 20 and 22 are intended to represent the tissue forming the "pinna" of a human ear. With reference to FIG.

2, the meatus of the external auditory canal 24 is illustrated schematically as a circle (in phantom) generally at the center of the left ear 20.

The support 12 is configured to be supported by the head 18. Thus, the support 12 can be in the form of any known headwear. For example, but without limitation, the support 12 can be in the form of a hat, sweatband, tiara, helmet, headphones, and eyeglasses.

Advantageously, the support 12 is configured to support the speakers 14, 16 at a position juxtaposed to the ears 20, 22, respectively, without applying a force against the ears 20, 22 sufficient for anchoring the speakers 14, 16 in place. Thus, the support 12 contacts the head 18 at a position other than the outer surface of the ears 20, 22. As shown in FIG. 1, the support 12 is supported by the head 18 by a support portion 26 which contacts a portion of the head 18 other than the outer surface of the ears 20, 22. For example, but without limitation, the support 26 can contact the top of the head 18, the sides of the head, top of the nose 19, forehead, occipital lobe, etc.

The audio device 10 also includes support members 28, 30 which extend from the support 12 to the speakers 14, 16, respectively. The support members 28, 30 are provided with sufficient strength to maintain the position of the speakers 14, 16 such that the speakers 14, 16 are spaced from the outer surface of the ears 20, 22.

Optionally, the support members 28, 30 can be made from a flexible material configured to allow the speakers 14, 16 to be moved toward and away from the ears 20, 22, respectively. Alternatively, the support members 28, 30 can be mounted relative to the support 12 with a mechanical device configured to allow the speakers 14, 16 to be moved toward and away from the ears 20, 22 respectively. The same mechanical device or an additional mechanical device can also optionally be configured to allow the speakers 14, 16 and/or supports 28, 30 to be translated forward and rearwardly relative to the support 12. Further, such mechanical devices can be used in conjunction with the flexibility provided to the support members 28, 30 from a flexible material noted above. As such, the user can adjust the spacing between the speakers 14, 16 and the ears 20, 22 to provide the desired spacing.

As noted above, the speakers 14, 16 are spaced from the ears 20, 22 such that the speakers 14, 16 do not engage the outer surface of the ears 20, 22 with sufficient force to provide an anchoring effect for the speakers 14, 16. Thus, the speakers 14, 16 can make contact with the ears 20, 22, at a pressure less than that sufficient to cause discomfort to the user.

Comfort of the user is further enhanced if the support 12 is configured to maintain gaps 32, 34 between the speakers 14, 16 and the ears 20, 22, respectively. As such, the chance of irritation to the user's ears 20, 22 is eliminated. Preferably, the gaps 32, 34 are within the range from about 2 mm to about 3 cm. The gaps 32, 34 can be measured from the inner surface of the speakers 14, 16 and the outer surface of the tragus (small projection along the front edge of a human ear which partially overlies the meatus of the external auditory canal 24) (FIG. 2).

Such a spacing can allow the support 12 to be removed and replaced onto the head 18 of the user without rubbing against the ears 20, 22. This makes the audio device 10 more convenient to use.

Figure 3A:
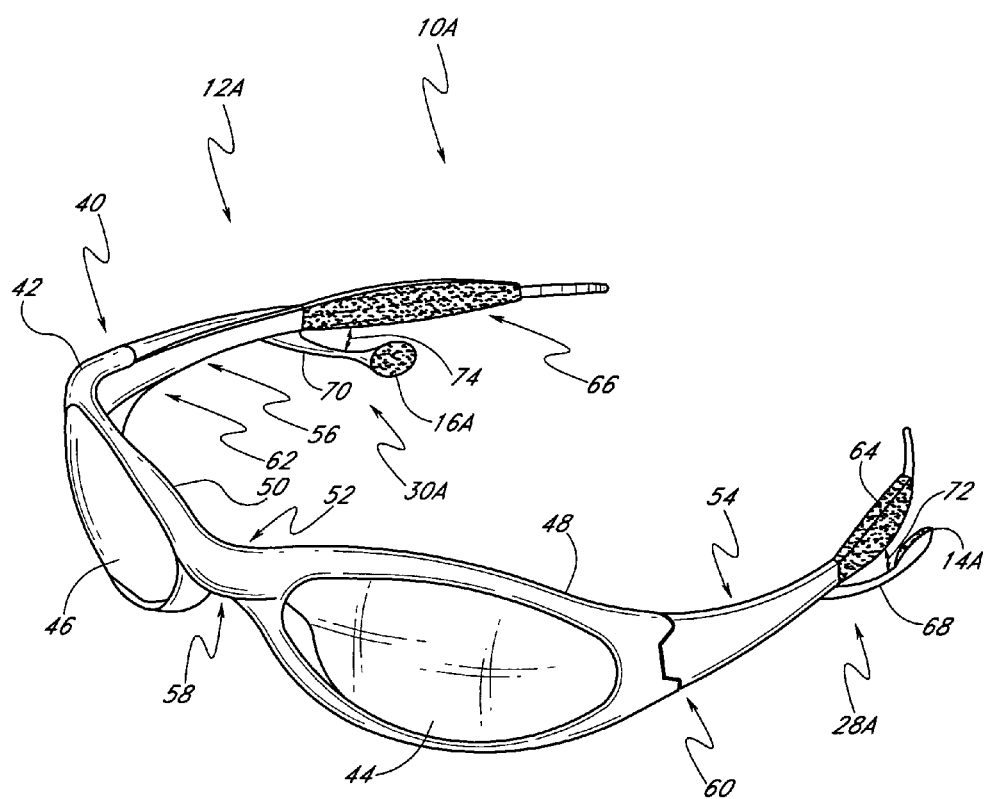
FIG. 3A is a front, left side, and top perspective view of a modification of the wearable audio device illustrated in FIGS. 1 and 2.
Figure 3B:
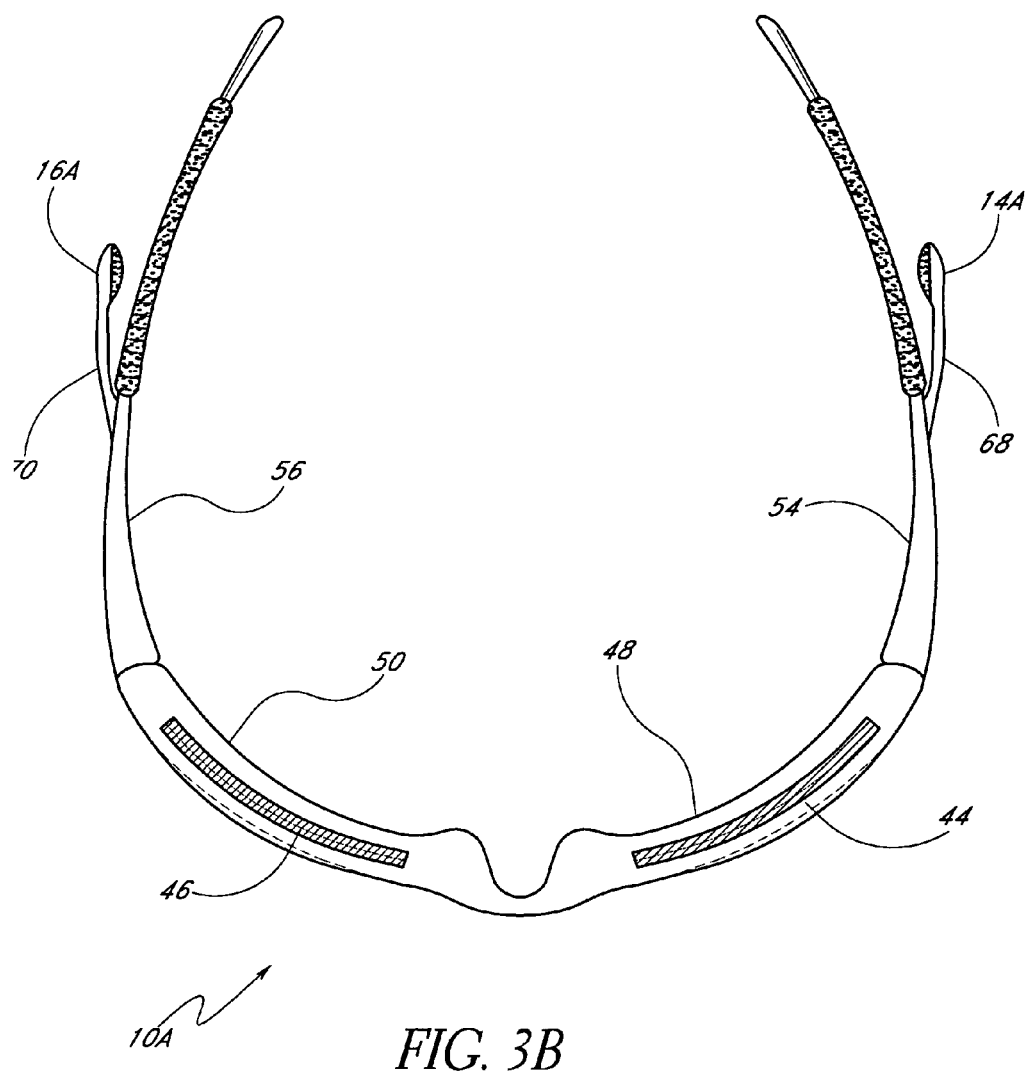
FIG. 3B is a top plan view of the audio device illustrated in FIG. 3A.
Figure 3C:
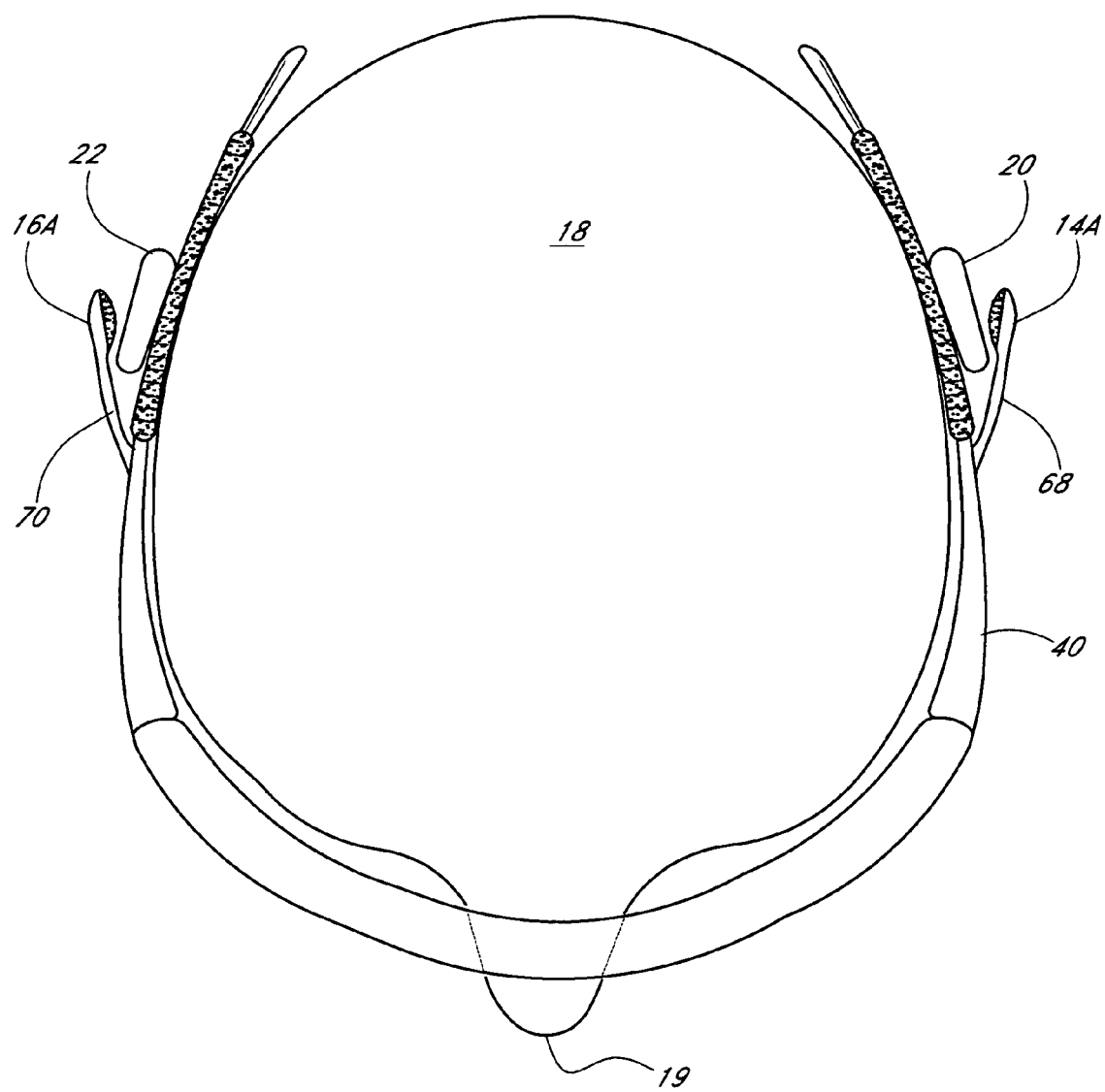
FIG. 3C is a schematic top plan view of the audio device of FIG. 3A being worn on the head of a user.
Figure 3D:
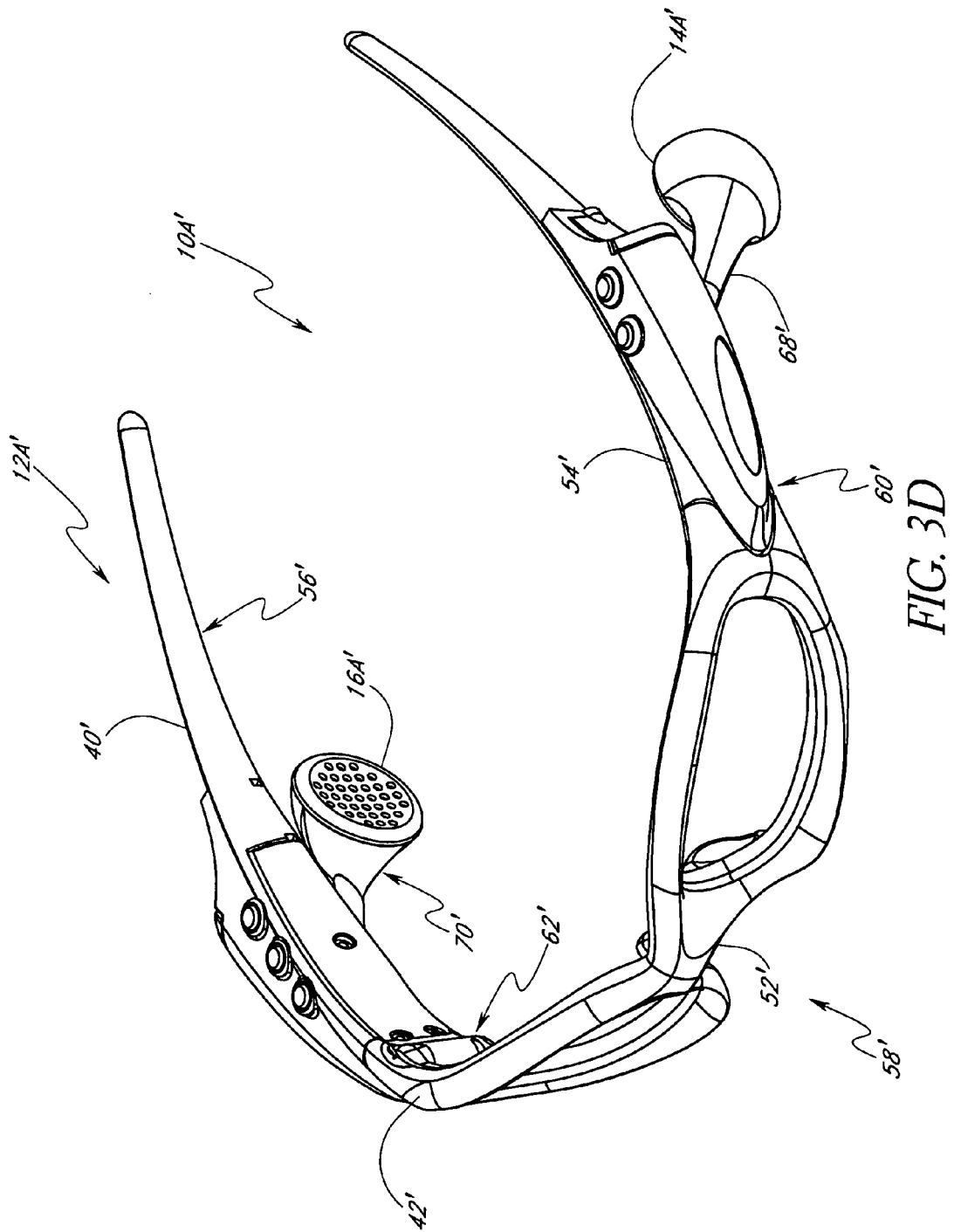
FIG. 3D is a front, top, and left side perspective view of another modification of the wearable audio devices illustrated in FIGS. 1, 2 and 3A–C.

A modification of the audio device 10 is illustrated in FIG. 3A, and referred to generally by the reference numeral 10A. Components of the audio device 10A that are the same as the audio device 10 have been given the same reference numeral, except that a letter "A" has been added thereto.

In the illustrated embodiment of the audio device 10A, the support 12A is in the form of an eyeglass 40. The eyeglass 40 comprises a frame 42 which supports left and right lenses 44, 46. Although the present audio device 10A will be described with reference to a dual lens eyeglass, it is to be understood that the methods and principles discussed herein are readily applicable to the production of frames for unitary lens eyeglass systems and protective goggle systems as well. Further, the lenses 44, 46 can be completely omitted. Optionally, at least one of the lenses 44, 46 can be in the form of a view finder or a video display unit configured to be viewable by a wearer of the support 12A.

Preferably, the lenses 44, 46 are configured to provide variable light attenuation. For example, each of the lenses 44, 46 can comprise a pair of stacked polarized lenses, with one of the pair being rotatable relative to the other. For example, each lens of the stacked pairs can comprise an iodine stained polarizing element. By rotating one lens relative to the other, the alignment of the polar directions of the lenses changes, thereby changing the amount of light that can pass through the pair. U.S. Pat. No. 2,237,567 discloses iodine stained polarizers and is hereby expressly incorporated herein by reference. Additionally, rotatable lens designs are disclosed in U.S. Pat. No. 4,149,780, which is hereby expressly incorporated herein by reference.

Alternatively, the lenses 44, 46, can comprise photochromic compositions that darken in bright light and fade in lower light environments. Such compositions can include, for example, but without limitation, silver, copper, and cadmium halides. Photochromic compounds for lenses are disclosed in U.S. Pat. Nos. 6,312,811, 5,658,502, 4,537,612, each of which are hereby expressly incorporated by reference.

More preferably, the lenses 44, 46 comprise a dichroic dye guest-host device configured to provide variable light attenuation. For example, the lenses 44, 46 can comprise spaced substrates coated with a conducting layer, an alignment layer, and preferably a passivation layer. Disposed between the substrates is a guest-host solution which comprises a host material and a light-absorbing dichroic dye guest. A power circuit (not shown) can be supported by the frame 42. The power circuit is provided with a power supply connected to the conducting layers. Adjustment of the power supply alters the orientation of the host material which in turn alters the orientation of the dichroic dye. Light is absorbed by the dichroic dye, depending upon its orientation, and thus provides variable light attenuation. Such a dichroic dye guest-host device is disclosed in U.S. Pat. No. 6,239,778, which is hereby expressly incorporated by reference.

The frame 42 also comprises left and right orbitals 48, 50 for supporting the left and right lenses 44, 46, respectively. Although the present inventions will be described in the context of a pair of orbitals 48, 50 which surround the respective lenses 44, 46, the principles of the present inventions also apply to eyeglass systems in which the frame only partially surrounds the lens or lenses, or contacts only one edge or a portion of one edge of the lens or each lens as well. In the illustrated embodiment, the orbitals 48, 50 are connected by a bridge portion 52.

The eyeglass 40 is also provided with a pair of generally rearwardly extending ear stems 54, 56 configured to retain the eyeglass 40 on the head of a wearer. In addition, an open region 58 is configured to receive the nose of the wearer, as is understood in the art. The open region 58 may optionally be provided with a nose piece, either connected to the lens orbitals 48, 50, or the bridge 52, or directly to the lenses, depending on the particular embodiment. Alternatively, the nose piece may be formed by appropriately sculpting the medial edges of the orbitals 48, 50 and the lower edge of the bridge 52, as in the illustrated embodiment.

The frame 42 and the ear stems 54, 56 can be made from any appropriate material, including polymers and metals. Preferably, the frame 42 and the ear stems 54, 56 are manufactured from a polymer. The orbitals 48, 50 can be separately formed and assembled later with a separately manufactured bridge 52, or the orbitals 48, 50 and bridge 52 can be integrally molded or cast. When a metal material is used, casting the eyeglass components directly into the final configuration desirably eliminates the need to bend metal parts.

The ear stems 54, 56 are pivotally connected to the frame 42 with hinges 60, 62. Additionally, the ear stems 54, 56 preferably include padded portions 64, 66, respectively. The padded portions preferably comprise a foam, rubber, or other soft material for enhancing comfort for a wearer. The padded portions 64, 66 preferably are positioned such that when the audio device 10A is worn by a wearer, the padded portions 64, 66 lie between the side of the user's head and the superior crux and/or upper portion of the helix of the wearer's ears.

In the illustrated embodiment, the support members 28A, 30A are in the form of support arms 68, 70 extending downwardly from the ear stems 54, 56, respectively. As such, the speakers 14A, 16A can be precisely positioned relative to the ears 20, 22 (FIG. 1) of a wearer's head 18. In particular, because the eyeglass 40 is generally supported at three positions, the alignment of the speakers 14A, 16A with the ears 20, 22 can be reliably repeated. In particular, the eyeglass 40 is supported at the left ear stem in the vicinity of the left ear 20, at the bridge 52 by a portion of the user's head in the vicinity of the nose 19, and at the right ear stem 56 by a portion of the user's head 18 in the vicinity of the ear 22.

Optionally, the support arms 68, 70 can be flexible. Thus, users can adjust the spacing 32, 34 between the speakers 14A, 16A and the ears 20, 22, respectively. Once a wearer adjusts the spacing of the speakers 14A, 16A from the ears 20, 22, respectively, the spacing will be preserved each time the wearer puts on or removes the eyeglass 40.

Further, the support arms 68, 70 can be attached to the ear stems 54, 56, respectively, with mechanical devices (not shown) configured to allow the support arms 68, 70 to be adjustable. For example, such a mechanical device can allow the support arms 68, 70 to be pivoted, rotated, and/or translated so as to adjust a spacing between the speakers 14A, 16A and the ears 20, 22. The same mechanical devices or other mechanical devices can be configured to allow the support arm 68, 70 to be pivoted, rotated, and/or translated to adjust a forward to rearward alignment of the speakers 14A, 16A and the ears 20, 22, respectively. Such mechanical devices are described in greater detail below with reference to FIGS. 3D–J.

With the configuration shown in FIG. 3A, the audio device 10A maintains the speakers 14A, 16A in a juxtaposed position relative to the ears 20, 22, respectively, and spaced therefrom. Thus, the user is not likely to experience discomfort from wearing and using the audio device 10A.

Preferably, the support arms 68, 70 are raked rearwardly along the ear stems 54, 56, respectively. As such, the support arms 68, 70 better cooperate with the shape of the human ear. For example, the helix and the lobe of the human ear are generally raised and extend outwardly from the side of a human head. The helix extends generally from an upper forward portion of the ear, along the top edge of the ear, then downwardly along a rearward edge of the ear, terminating at the lobe. However, the tragus is nearly flush with the side of the human head. Thus, by arranging the support arm 68, 70 in a rearwardly raked orientation, the support arms 68, 70 are less likely to make contact with any portion of the ear. Particularly, the support arms 68, 70 can be positioned so as to be lower than the upper portion of the helix, above the lobe, and preferably overlie the tragus.

Alternatively, the support arm 68, 70 can be attached to the ear stems 54, 56, respectively, at a position rearward from the meatus of the ears 20, 22 when the eyeglass 40 is worn by a user. As such, the support arms 68, 70 preferably are raked forwardly so as to extend around the helix and position the speakers 14A, 16A over the tragus. This construction provides a further advantage in that if a user rotates the eyeglass 40 such that the lenses 44, 46 are moved upwardly out of the field of view of the wearer, the speakers 14A, 16A can be more easily maintained in alignment with the ears 20, 22 of the wearer.

Preferably, the support arm 68, 70 are raked rearwardly so as to form angles 72, 74 relative to the ear stems 54, 56. The angles 72, 74 can be between 0 and 90 degrees. Preferably, the angles 72, 74 are between 10 and 70 degrees. More preferably, the angles 72, 74 are between 20 and 50 degrees. The angles 72, 74 can be between about 35 and 45 degrees. In the illustrated embodiment, the angles 72, 74 are about 40 degrees.

Optionally, the support arm 68, 70 can be curved. In this configuration, the angles 72, 74 can be measured between the ear stems 54, 56 and a line extending from the point at which the support arm 68, 70 connect to the ear stems 54, 56 and the speakers 14A, 16A.

The audio device 10A can be used as an audio output device for any type of device which provides an audio output signal. The audio device 10A can include an audio input terminal disposed anywhere on the eyeglass 40 for receiving a digital or analog audio signal. Preferably, wires connecting the input jack (not shown) with the speakers 14A, 16A extend through the interior of the ear stems 54, 56 so as to preserve the outer appearance of the eyeglass 40. Alternatively, the audio device 10A can include a wireless transceiver for receiving digital signals from another device.

With reference to FIGS. 3D–3J, a modification of the audio devices 10, 10A is illustrated therein and referred to generally by the reference numeral 10A'. The audio device 10A' can include the same components as the audio devices 10, 10A except as noted below. Components of the audio device 10A' that are similar to the corresponding components of the audio devices 10, 10A are identified with the same reference numerals except, that a "'" has been added thereto.

The audio device 10A' is in the form of an eyeglass 12A' having a frame 40A'. The audio device 10A' also includes a device for the storage and playback of a sound recording.

As noted above, an aspect of at least one of the inventions disclosed herein includes a realization that the forward to rearward spacing of the bridge of a human nose to the auditory canal of the ear falls into a relatively narrow range of distances for large portions of the population. For example, the forward-to-rearward spacing from the bridge of the nose to the auditory canal is normally between about 4 ⅞ inches to about 5 ⅛ inches, and often between about 4

¾ inches and about 5 ¼ inches. Corresponding anterior-posterior plane adjustability of the speakers is preferably provided.

Figure 3E:
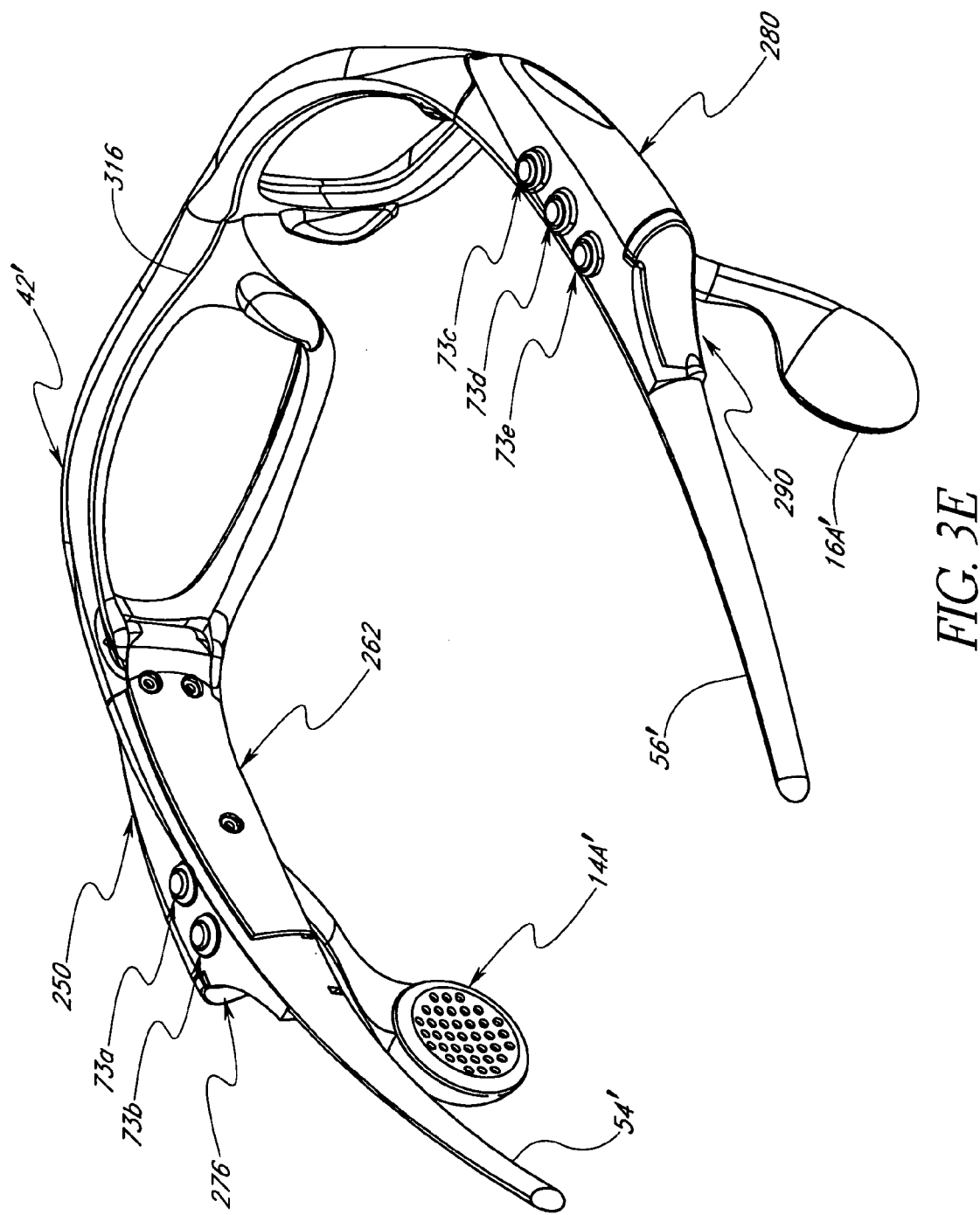
FIG. 3E is a rear, top and right side perspective view of the wearable audio device illustrated in FIG. 3D.
Figure 3F:
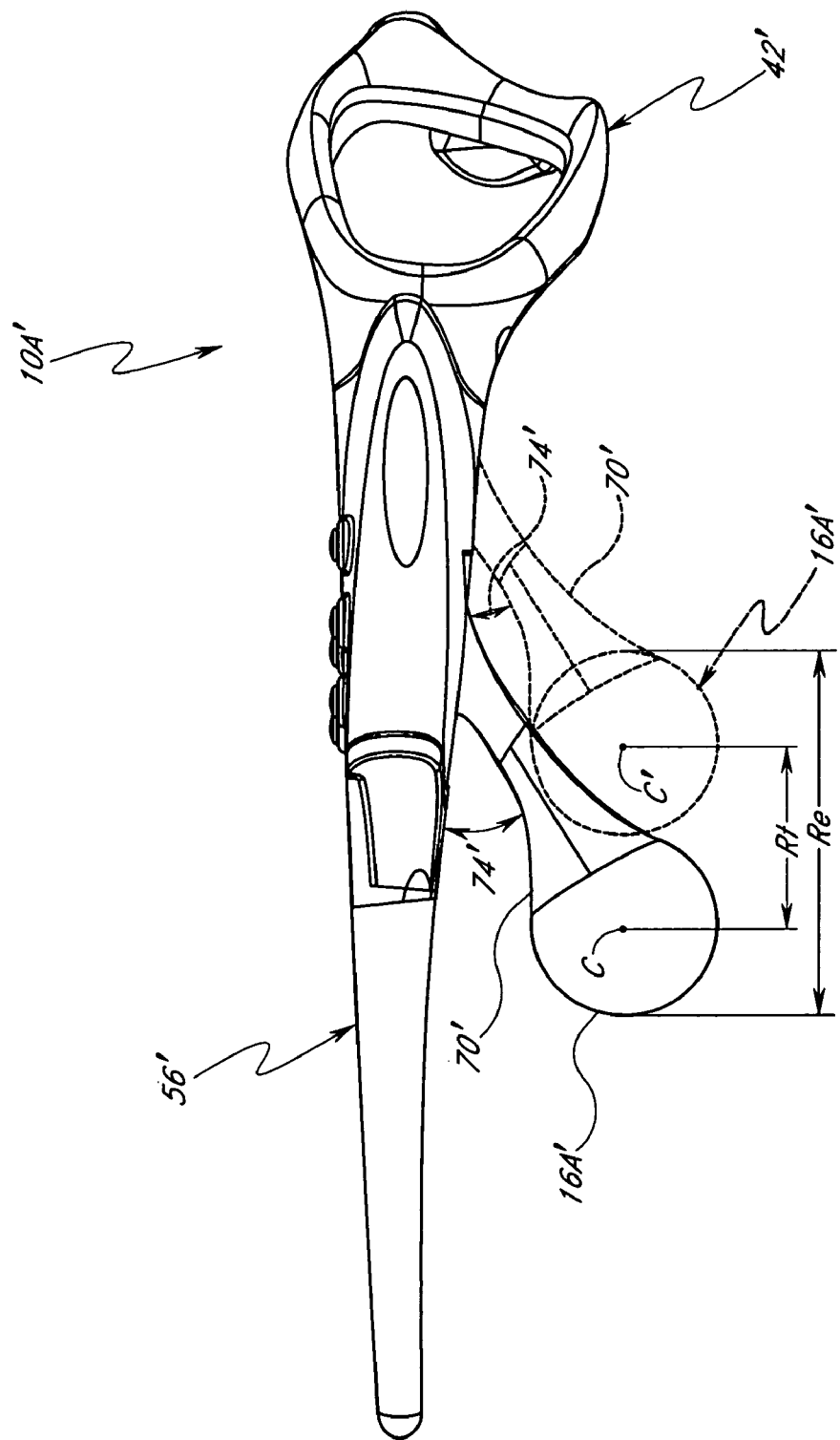
FIG. 3F is a right side elevational view of the wearable audio device illustrated in FIG. 3D.

Thus, with reference to FIG. 3F, the audio device 10A' is configured such that the supports 68', 78', can translate, along a forward to rearward direction, over a range identified generally by the reference numeral Rt. Preferably, the range Rt is at least about ⅛ of one inch. Further, the range Rt can be at least about ¼ of one inch. Further, the range Rt can be in the range of from about 0.25 inches to about 1.5 inches, and, in one construction, is about 0.75 of one inch. As such, a substantial percentage of the human population will be able to align a Center of the speakers 14A', 16A' with their auditory canal.

Figure 3G:
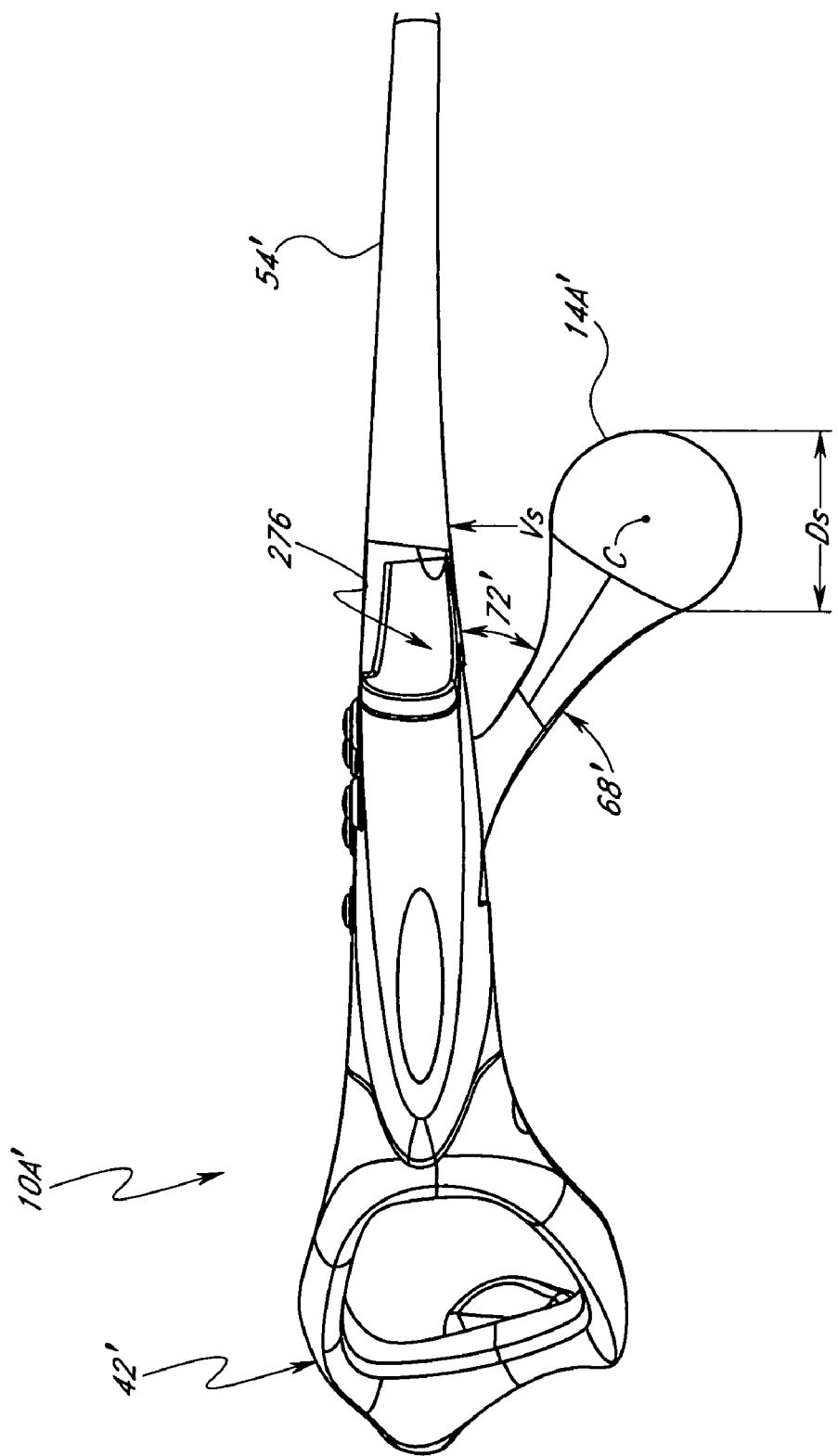
FIG. 3G is a left side elevational view of the wearable audio device illustrated in FIG. 3D.

With reference to FIG. 3G, a further advantage is provided where the diameter Ds of the speakers 14A', 16A' is greater than about 0.5 inches, such as about 1 inch or greater. As such, an effective range Re (FIG. 3F) over which the speakers 14A', 16A' can reach, is significantly enhanced with respect to the above-noted nose bridge to auditory canal spacings for humans.

Thus, the connection between the supports 68', 70' to the ear stems 54', 56', respectively, can be configured to allow a limited translational range of movement of Rt yet provide a larger range of coverage Re.

Preferably, the connection between the support 68', 70' and the ear stems 54', 56', is configured such that the translational position of the speakers 14A', 16A' is maintained when a user removes the audio device 10A' from their head. For example, the connection between the supports 68', 70', and the ear stems 54', 56' can generate sufficient friction so as to resist movement due to the weight of the supports 68', 70' and the speakers 14A', 16A'. Alternatively, the connection or an adjustment device can include locks, clips, or other structures to prevent unwanted translational movement of the speakers 14A', 16A'. As such, a further advantage is provided in that a user can repeatedly remove and replace the audio device 10A' without having to readjust the translational position of the speakers 14A', 16A'.

Another advantage is provided where the supports 68', 70' are made from a material that is substantially rigid, at least at room temperature. For example, with reference to FIG. 3F, the angles 72', 74' defined between the supports 68', 70' and the ear stems 54', 56', respectively, can be maintained at a predetermined value while the speakers 14A', 16A' can be moved over the range Rt. Thus, as noted above with reference to FIG. 3A and the description of the angles 72, 74, the angles 72', 74' can be maintained at a desired angle as a user moves the speakers 14A', 16A' over the range Rt.

Optionally, the supports 68', 70' can be made from a material that can be deformed at room temperature. However, more preferably the material is sufficiently rigid such that substantial pressure is required to change the angle 74'. Alternatively, the supports 68', 70' can be made from a thermally sensitive material that can be softened with the application of heat. Thus, a wearer of the audio device 10A' can heat the supports 68', 70' and adjust the angle 74' to optimize comfort for the particular wearer. Such thermal sensitive materials are widely used in the eyewear industry and thus a further description of such materials is not deemed necessary for one of ordinary skill in the art to make and use the inventions disclosed herein.

Preferably, the angles 72', 74' are sized such that the spacing Vs between the center C of the speakers 14A', 16A' and a lower surface of the ear stems 54', 56' is within the range of about 0.75 of an inch to about 1.25 inches. One aspect of at least one of the inventions disclosed herein includes the realization that there is little variation in the spacing for adult humans between the center of the auditory canal and the connecting tissue between the pinna of the ear and the skin on the side of the head. In particular, it has been found that in virtually all humans, the distance between the upper most connection of the ear and the head to the center of the auditory canal is between 0.75 of an inch and 1.25 inches. Thus, by sizing the angles 72', 74' such the spacing Vs is between about 0.75 of an inch and 1.25 inches, the audio device 10A can be worn by virtually any adult human and has sufficient alignment between the wearer's auditory canal and the center C of the speakers 14A', 16A'. Further, where the diameter Ds of the speakers 14A', 16A' is about 1 inch, almost any human can wear the audio device 10A' without having to adjust the angles 72', 74'. In other words, the auditory canal of virtually any human would be aligned with a portion of the speakers 14A', 16A' although the wearer's auditory canal might not be precisely aligned with the center C of the speakers 14A', 16A'.

Figure 3H:
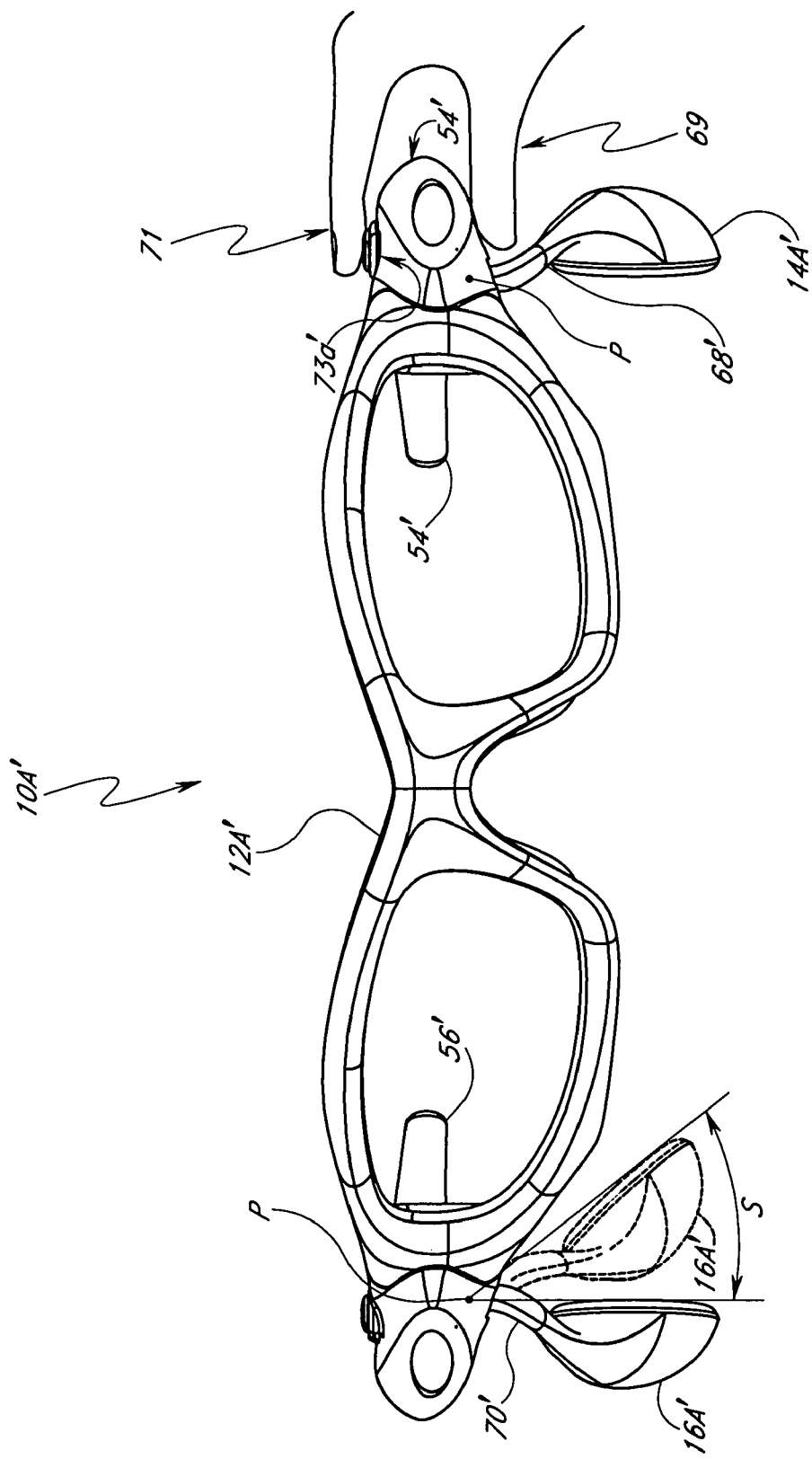
FIG. 3H is a front elevational view of the wearable audio device illustrated in FIG. 3D.

With reference to FIG. 3H, the supports 68', 70' are configured to allow the speakers 14A', 16A', respectively, to pivot toward and away from an ear of a user. For example, as shown in FIG. 3H, the supports 68', 70' are connected to the ear stems 54', 56', respectively, so as to be pivotable about a pivot axis P. As such, the speakers 14A', 16A' can be pivoted or swung about the pivot axis P.

The range of motion provided by the connection between the supports 68', 70' and the ear stems 54', 56' is identified by the angle S in FIG. 3H. In FIG. 3H, the speaker 14A' is illustrated in an intermediate position in the range of motion provided by the connection between the support 68' and the ear stem 54'.

The illustration of the speaker 16A' includes a solid line representation showing a maximum outward position of the speaker 16A'. Additionally, FIG. 3H includes a phantom illustration of the speaker 16A' in a maximum inward position. The angle S illustrates a range of motion between a maximum outward position (solid line) and a maximum inward position (phantom line) of the speaker 16A'.

Preferably, the range of motion S is sufficiently large to allow any human wearer of the audio device 10A' to position the speakers 14A', 16A' such that sound emitted from the speakers 14A', 16A' is clearly audible yet comfortable for the wearer of the audio device 10A'. For example, human ears vary in the precise shape and size of the outwardly facing features. As such, one wearer of the audio device 10A' may have outer facing features of their ear that project further than another wearer of the audio device 10A'. Thus, one wearer may prefer the speakers 14A', 16A' to be positioned more inwardly than another wearer.

Further, some wearers of the audio device 10A' may prefer to press the speakers 14A', 16A' into contact with the outer surfaces of their ears. For example, some users may desire to experience to loudest possible volume from the speakers 14A', 16A'. Thus, by pressing the speakers 14A', 16A' against their ears, the perceived volume of the sound emitted from the speakers 14A', 16A' will be the greatest.

Alternatively, other users may prefer to have the speakers spaced from the outer surfaces of their ear so as to prevent contact with the ear, yet maintain a close spacing to preserve the perceived volume of the sound emitted from the speakers 14A', 16A'. Additionally, a user may occasionally wish to move the speakers 14A', 16A' further away from their ears, so as to allow the wearer better hear other ambient sounds when the speakers 14A', 16A' are not operating. For example, a wearer of the audio device 10A' might wish to use a cellular phone while wearing the audio device 10A'.

Thus, the wearer can pivot one of the speakers 14A', 16A' to a maximum outward position (e.g., the solid line illustration of speaker 16A' in FIG. 3H) to allow a speaker of the cell phone to be inserted in the space between the speaker 16A' and the ear of the wearer. As such, the wearer can continue to wear the audio device 10A' and use another audio device, such as a cell phone. This provides a further advantage in that, because the audio device 10A' is in the form of eyeglasses 12A', which may include prescription lenses or tinted lenses, the wearer of the audio device 10A' can continue to receive the benefits of such tinted or prescription lenses while using the other audio device.

An additional advantage is provided where the pivotal movement of the supports 68', 70' is isolated from the translational movement thereof. For example, the connection between the supports 68', 70' and the ear stems 54', 56' can be configured so as to allow a user to pivot the supports 68', 70' without substantially translating the supports 68', 70' forwardly or rearwardly. In one embodiment, the connections can be configured to provide more perceived frictional resistance against translational movement than the frictional resistance against pivotal movement about the pivot axis P (FIG. 3H). Thus, a user can easily pivot the speakers 14A', 16A' toward and away from their ears without translating the speakers 14A', 16A'. Thus, the procedure for moving the speakers 14A', 16A' toward and away from a wearer's ears can be performed more easily and, advantageously, with one hand.

The range of motion S is generally no greater than about 180°, and often less than about 90°. In one preferred embodiment, the range of motion S is no more than about 30° or 40°. The connection between the support 68', 70' and the ear stems 54', 56', respectively, is generally configured to provide a sufficient holding force for maintaining a rotational orientation of the speakers 14A', 16A' about the pivot axis P. For example, the connection between the supports 68', 70' and the ear stems 54', 56', respectively, can be configured to generate sufficient friction to resist the forces generated by normal movements of a wearer's head.

A further advantage is achieved where sufficient friction is generated to prevent the pivotal movement of the speakers 14A', 16A' when the audio device 10A' is removed from the wearer and placed on a surface such that the speakers 14A', 16A' support at least some of the weight of the audio device 10A'. For example, when a wearer of the audio device 10A' removes the audio device 10A' and places it on a table with the speakers 14A', 16A' facing downwardly, the speakers 14A', 16A' would support at least some of the weight of the audio device 10A'. Thus, by providing sufficient friction in the connection between the supports 68', 70' and the ear stems 54', 56', respectively, the position of the speakers 14A', 16A' can be maintained. Thus, when the wearer replaces the audio device 10A', the speakers 14A', 16A' will be in the same position, thereby avoiding the need for the wearer to reposition speakers 14A', 16A'.

As noted above, an aspect of one of the inventions disclosed herein includes the realization that where an electronic device that is worn in the same manner as a pair of eyeglasses includes a user operable switch for controlling a function of the electronics, the comfort of the wearer of the audio device can be enhanced where the switches are operable without transferring a substantial load to the head of the wearer. For example, where the electronic device includes buttons for controlling an aspect of the device, a further advantage is provided where a support surface is provided opposite the button such that a user can apply a balancing force to the actuation force applied to the button, thereby preventing a substantial force from being transferred to the head of the wearer.

Figure 31:
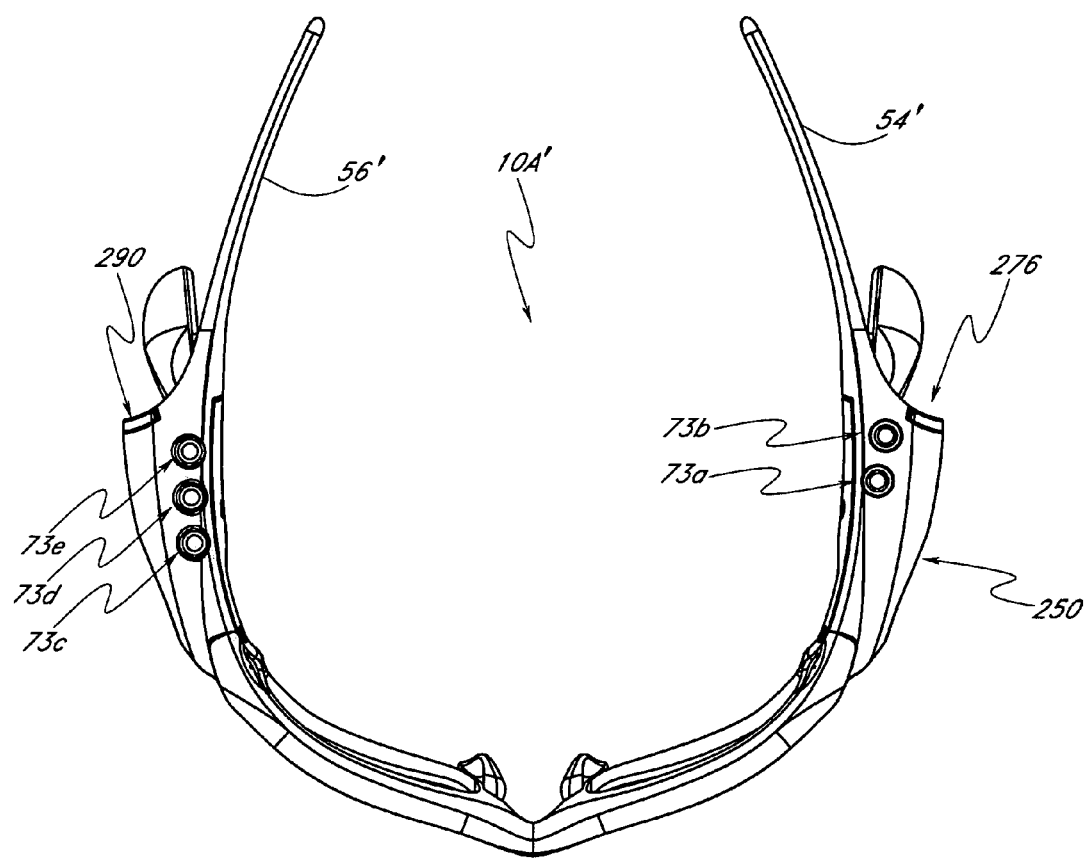

With reference to FIG. 31, the audio device 10A' can include at least one button 73a. In the illustrated embodiment, the audio device 10A' includes five buttons; a first button 73a and a second button 73b mounted to the left ear stem 54', and a third button 73c, a fourth button 73d, and a fifth button 73e mounted to the right ear stem 56'. Of course, this is one preferred embodiment of the arrangement of the buttons 73a, 73b, 73c, 73d, 73e. Other numbers of buttons and other arrangements of buttons are also applicable.

As shown in FIG. 3H, the button 73a is mounted on an upwardly facing surface of the ear stem 54'. Additionally, the ear stem 54' has a lower surface that faces in a generally opposite direction to the direction towards which the upper surface of the ear stem 54' faces. Thus, as shown in FIG. 3H, the user can use a finger 71 to actuate the button 73a and a thumb 69 to counteract the actuation force of the finger 71 by pressing on the lower surface of the ear stem 54'. As such, the wearer or user of the audio device 10A' can actuate the button 73a without imparting a substantial load to the wearer of the audio device 10A'.

This provides a further advantage in that a repeated application of a force against the audio device 10A' that is transferred to the head of the wearer of the audio device 10A' is avoided. For example, where the audio 10A' is in the form of eyeglasses 12A', a wearer of the eyeglasses 12A' can be subjected to irritations if the wearer repeatedly presses the eyeglasses 12A' to actuate a switch. Further, such repeated loads can cause headaches. Thus, by configuring the ear stems 54A' such that the button 73a can be depressed without transferring a substantial load to the wearer of the ear glasses 12A', such irritations and headaches can be avoided.

Further, by disposing the button 73a on an upper portion of the ear stems 54A', and by providing the ear stems 54A' with an opposite lower surface that faces an opposite direction relative to the upper surface, a wearer can grasp the ear stems 54A' from the side, as illustrated in FIG. 38, thereby allowing the user to counteract the actuation force required to actuate the button 73a without having to insert a finger between a side of the wearer's head and ear stems 54A'.

Figure 3J:
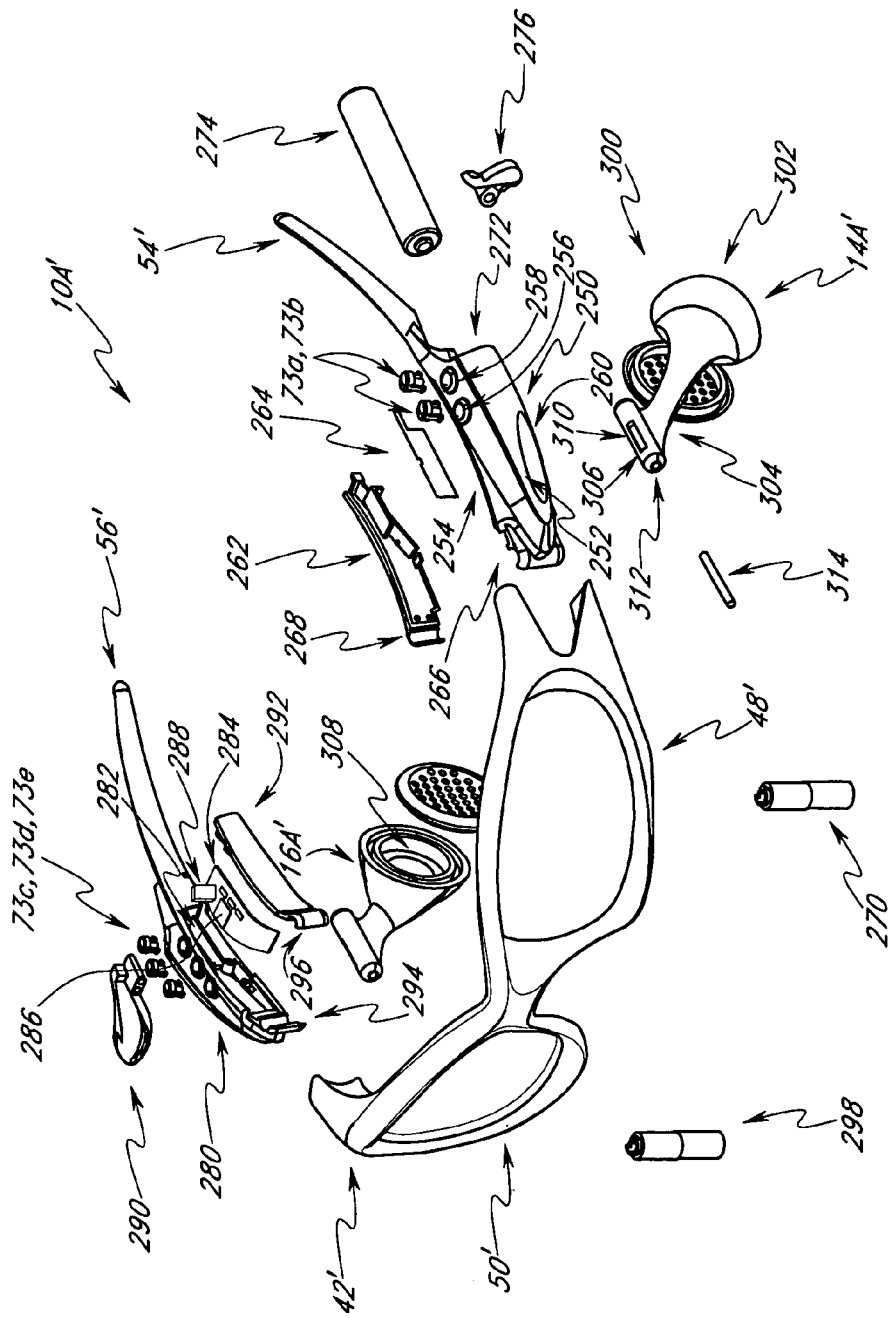
FIG. 3J is a front, top, and left side perspective and exploded view of the wearable audio device illustrated in FIG. 3D.

FIG. 3J illustrates an exemplary embodiment of the audio device 10A. As shown in FIG. 3J, the left side ear stem 54A' defines an electronic housing portion 250 which defines an internal cavity 252 configured to receive electronic components. The electronics housing 250 includes an upper surface 254 and lower surface 256. The upper surface 254 extends generally outwardly from the ear stems 54A' and around the internal cavity 252. The upper surface also includes apertures 256, 258 through which the button 73a, 73b, respectively, extend.

The housing 250 includes a lower surface 260. The lower surface 260 (which may contain apertures or slots) faces in an opposite direction from the upper surface 254 of the housing 250. Preferably, the lower surface 260 is at least about 0.5 inches, and may be 0.75 inches or more wide. As such, the lower surface 260 provides a surface which allows a wearer to easily grasp the ear stems 54A' so as to balance an actuation force supplied to the button 73a, 73b.

A cover member 262 cooperates with the housing 250 to define the closed internal cavity 252. In the illustrated embodiment, the internal cavity 252 includes at least one compartment configured to receive an electronic circuit board 264 which includes at least one switch for each of the buttons 73a, 73b. In an exemplary but non-limiting embodiment, the board 264 can include two switches, one for each of the buttons 73a, 73b, which are configured to control a volume output from the speakers 14A', 16A'. The cover 262 can be attached to the ear stems 54A' with any type of fastener, such as, for example, but without limitation, screws, rivets, bolts, adhesive, and the like.

In the illustrated embodiment, the housing 250 also defines a hinge recess 262. Additionally, the cover member 262 includes a complimentary hinge recess 268. The recesses 266, 268 are sized to receive a hinge pin 270. In the illustrated embodiment, the hinge pin 270 is hollow and includes an aperture therethrough. The ends of the hinge pin 270 are configured to be engaged with corresponding portions of the frame 42' so as to anchor the position of the hinge pin 270 relative to the frame 42'. When the cover 262 is attached to the housing 250, with the hinge pin 270 disposed in the recesses 266, 268, the ear stem 54A' is pivotally mounted to the frame 42'. The aperture extending through the hinge pin 270 provides a passage through which electrical conduits can pass, described in greater detail below.

The housing 250 also includes a power source recess (not shown). The power source recess includes an opening 272 sized to receive a power storage device 274. In the illustrated embodiment, the power storage device 274 is in the form of an AAAA-sized battery. Of course, the power storage device 274 can be in the form of any type or any size of battery and can have any shape. However, a further advantage is provided where a standard-sized battery such as an AAAA battery is used. For example, as described in greater detail below, this size battery can be conveniently balanced with other electronic components configured for playback of a sound recording.

A door 276 is configured to close the opening 272. In the illustrated embodiment, the door 276 is preferably hingedly connected to a housing 250 so as to allow the door to be rotated between an open position and a closed position. FIGS. 3D–3I illustrate the door 276 in a closed position.

The ear stem 56' includes a housing 280 defining an internal cavity 282 configured to receive at least one electronic component. The housing 280 also includes upper and lower surfaces (unnumbered) that can be configured identically or similarly to the upper and lower surfaces 254, 260 of the housing 250. However, in the illustrated embodiment, the upper surface of the housing 280 includes 3 apertures configured to receive portions of the buttons 73c, 73d, 73e. Thus, a further description of the housing 280 is not necessary for one of ordinary skill in the art to make and use the inventions disclosed herein.

The internal cavity 282, in the illustrated embodiment, is configured to receive a printed circuit board 284. In the illustrated embodiment, the printed circuit board 284 includes one switch for each of the buttons 73c, 73d, and 73e. Additionally, the printed circuit board 284 includes an audio file storage and playback device 286.

The device 286 can be configured to store and playback any type of electronic audio and/or video file. In the illustrated embodiment, the device 286 includes a memory, an amplifier, and a processor. The memory, amplifier, and the processor are configured to operate together to function as an audio storage and playback system. For example, the audio storage and playback system can be configured to store MP3 files in a memory and to play back the MP3 files through the speakers 14A', 16A'. Suitable electronics for enabling and amplifying MP3 storage and playback are well known in the art, and may be commercially available from Sigmatel, Inc. or Atmel, Inc. Thus, further description of the hardware and software for operating the device 286 as a storage and playback device is not necessary for one of ordinary skill in the art to make and use the inventions disclosed herein.

Advantageously, the printed circuit board 284 also includes or is in electrical communication with a data transfer port 388. In the illustrated embodiment, the housing 280 includes an aperture (not shown) disposed in a position similar to the position of the aperture 272 on the housing 250. In the housing 280, however, the aperture is aligned with the data transfer port 288. Thus, when the printed circuit board 284 is received in the internal cavity 282, the data transfer port 288 is aligned with the aperture.

A door 290 is configured to open and close the aperture through which the data port 288 is exposed. Preferably, the door 290 is hingedly engaged to the housing 280, in an identical or similar manner as the door 276. In the illustrated embodiment, the door 290 can be pivoted relative to housing 280, thereby exposing the data transfer port 288. In the illustrated embodiment, the data transfer port is configured to operate according to the universal serial bus (USB) transfer protocol. Optical data ports may alternatively be used. As a further alternative, MP3 files may be uploaded from a source using wireless systems, such as BLUETOOTH® protocols, as is discussed below. Further, the device 286 is configured to receive audio files from another computer, through the data transfer port 288 and to store the files into the memory incorporated into the device 286.

A cover 292 is configured to close the internal cavity 282. The cover 292 can be configured in accordance with the description of the cover 262. Similarly to the housing 250 and cover 262, the housing 280 and cover 292 include recesses 294, 296 configured to receive a hinge pin 298. The hinge pin 298 can be constructed identically or similarly to the hinge pin 270. Thus, with the hinge pin 298 engaged with a frame 42', the cover member 292 can be attached to the housing 280 with the hinge pin 298 received within the recesses 294, 296. As such, the ear stem 56A' can be pivoted relative to the frame 42'.

With continued reference to FIG. 3J, the speakers 14A', 16A' can be constructed in a similar manner, as a mirror image of each other. Each of the speakers 14A', 16A', include a housing member 300. Each housing member 300 includes a transducer housing 302, a support stem 304, and a guide portion 306.

The transducer housing portion 302 includes an internal recess 308 (identified in the illustration of speaker 16A'). The transducer recess 308 can be sized to receive any type of acoustic transducer. For example, but without limitation, the transducer recess 308 can be configured to receive a standard acoustic speaker commonly used for headphones. In a non-limiting embodiment, the speaker transducer (not shown) has an outer diameter of at least about 0.6 inches. However, this is merely exemplary, and other sizes of transducers can be used.

With reference to the illustration of the speaker 14A', the support stem 304 connects the transducer housing 302 with the guide portion 306. The support stem 304 includes an aperture therethrough (not shown) which connects the transducer recess 308 with the guide portion 306.

The guide portion 306 includes an aperture 310 which communicates with the aperture extending through the support stem 304. Thus, an electric conduit, described in greater detail below, can extend through the aperture 310, through the stem 304, and then to the transducer recess 308.

The guide portion 306 also includes a guide aperture 312. The guide aperture 312 is configured to receive a guide pin 314.

The guide pin 314 can be made from any material. In the illustrated embodiment, the guide pin 314 is a rod having an outer diameter of about 0.0625 of an inch. When assembled, the guide pin 314 is disposed within an open recess (not shown) disposed on an under surface of the housing 250. The aperture 312 is sized so as to slidably receive the pin 314. Thus, the guide portion 306 can translate relative to the pin 314 as well as rotate relative to the pin 314. The size of the aperture 312 can be configured to provide a slip fit with sufficient friction to provide the stable positions noted above with reference to FIGS. 3D–3I.

In this embodiment, the guide pin 314 and the aperture 312 provide both translational and pivotal movement. Additionally, the guide pin 314 and the aperture 312 can be configured to resistance to both translational movement and pivotal movement, with the resistance to translational movement being greater. For example, the axial length and diameter of the aperture 312, controls the maximum contact area between the guide pin 314 and the guide portion 306 and thus affects the frictional force generated therebetween. Thus, the length and diameter of the aperture 312 can be adjusted to achieve the desired frictional forces.

Figure 3K:
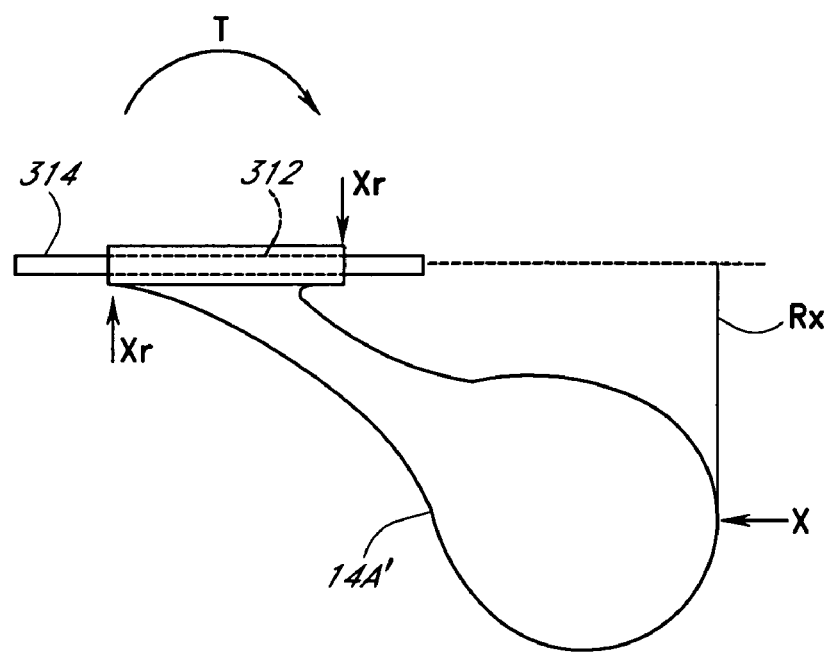
FIG. 3K is an enlarged left side elevational view of one of the speakers of the audio device illustrated in FIG. 3D.
Figure 3L:
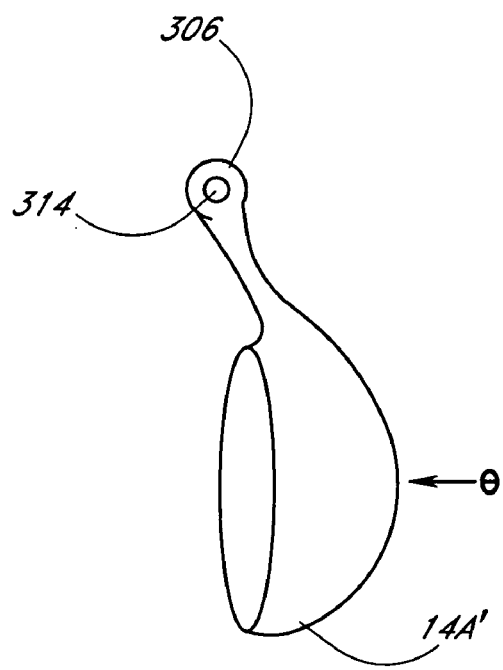
FIG. 3L is an enlarged front elevational view of the speaker illustrated in FIG. 3K.

Additionally, with reference to FIG. 3K, when a translational force X is applied to the speaker 14A', a torque T is created, which results in reaction forces Xr urging the guide portion 306 against the guide pin 314 at the forward and rearward ends thereof. These reaction forces Xr increase the frictional resistance against the translational movement of the speaker 14A'. However, as shown in FIG. 3L, when a pivot force Θ is applied to the speaker 14A', such reaction forces are not created, and the speaker 14A' can pivot about the guide pin 314 with seemingly less force applied as compared to the force X required to move the speaker 14A' in a direction parallel to the guide pin 314.

With reference again to FIG. 3J, the recess on the lower surface of the housings 250, 280, are sized so as to allow the guide portion 306 to slide in a forward to rearward direction in the range Rt, described above with reference to FIG. 3F. Additionally, the open recess on the lower surface of the housings 250, 280 is provided with a width to limit the range of motion S of the speakers 14A', 16A', described above with reference to FIG. 3H.

With reference to FIG. 3E, the frame 42' includes an interior electrical conduit channel 316 configured to receive an electrical conduit for connecting the speakers 14', 16', the printed circuit boards 264, 284, and the power storage device 274. For example, with reference to FIG. 3M, the buttons 73a, 73b, are connected to the device 286 through conduits 73ai, 73bi. The storage device 274 is connected to the device 286 through a power line 274i. Additionally, the speaker 14A' is connected to the device 286 with an audio output conduit 14Ai'.

As illustrated in FIG. 3M, portions of the conduits 73ai, 73bi, 274i and 14Ai', extend through the channel 316. In an exemplary embodiment, the conduits 73ai, 73bi, 274i, and 14Ai', can be in the form of a ribbon connector 318 extending through the channel 316. Thus, with reference to FIGS. 3J and 3M, the ribbon connector 318 can extend from the housing 280, into the recesses 294, 296, through an aperture (not shown) in the hinge pin 298 to the upper opening within the hinge pin 298, then through the channel 316 (FIG. 3E), to an upper opening of the hinge pin 270, out through an aperture (not shown) through a side of a hinge pin 270, through the recesses 266, 268 of the housing 250, and then to the speaker 14A', printed circuit board 264, and the power storage device 274.

The conduit 14Ai' can extend to the aperture 310 in the guide portion 306, through a central aperture of the support stem 304, and into the transducer recess 308, as to connect to a transducer disposed therein. Optionally, the portion of the conduit 14Ai' that extends out of the housing 250 and into the transducer housing 300 can be formed from an insulated metal conduit, or any other known conduit. The speaker 16A' can be connected to the printed circuit board 284 in a similar manner.

The buttons 73c, 73d, 73e and the data transfer port 288 are connected to the device 286 through printed conduits incorporated into the printed circuit board 284.

As noted above, one aspect of at least one of the inventions disclosed herein includes the realization that a desirable balance can be achieved by disposing a power storage device in one ear stem of an eyeglass and play-back device into the second ear stem. Thus, as illustrated in FIGS. 3J and 3K, the power storage device 274 is disposed in the left ear stem 54' and the storage and play-back device 286 is disposed in the right ear stem 56'.

In the illustrated embodiment, the buttons 73a and 73b for controlling the volume of the sound output from the speakers 14A', 16A'. For example, the button 73a can be used for increasing volume and the button 73b can be used for decreasing volume. Alternatively, the button 73b can be for increasing volume and the button 73a can be for decreasing volume. When a wearer of the audio device 10A' presses one of the buttons 73a, 73b, a simple on-off signal can be transmitted to the device 286. The device 286 can be configured to interpret the on-off signals from the buttons 73a, 73b as volume control signals and adjust the volume to the speakers 14A', 16A' accordingly.

Optionally, a third command can be generated by pressing both of the buttons 73a, 73b simultaneously. For example, but without limitation, the device 286 can be configured to interpret simultaneous signals from both the buttons 73a, 73b, as a signal for turning on and off an additional feature. For example, but without limitation, the additional feature can be a bass boost feature which increases the bass of the audio signal transmitted to the speakers 14A', 16A'. Of course, other functions can be associated with the buttons 73a, 73b.

The buttons 73c, 73d, 73e can be figured to operate switches to transmit control signals to the device 286 similarly to the buttons 73a, 73b. For example, but without limitation, the button 73c corresponds to a power button. For example, the device 286 can be configured to recognize a signal from the button 73c as a power on or power off request. In this embodiment, when the device 286 is off, and a signal from the button 73c is received, the device 286 can turn on. Additionally, the device 286, when in an on state, can be configured to turn off when a signal from the button 73c is received. Optionally, the device 286 can be configured to, when in an off or standby state, turn on and begin to play an audio file when a signal from the button 73c is received. Additionally, the device 286 can be configured to pause when another signal from the button 73c is received. In this embodiment, the device 286 can be configured to turn off only if the button 73c is held down for a predetermined amount of time. For example, the device 286 can be configured to turn off if the button 73c is held down for more than two seconds or for three seconds or for other periods of time.

The buttons 73d and 73e can correspond to forward and reverse functions. For example, the button 73d can correspond to a track skip function. In an illustrative but non-limiting example, such a track skip function can cause the device 286 to skip to a next audio file in the memory of the device 286. Similarly, the button 73*e* can correspond to a reverse track skip function in which the device 286 skips to the previous audio file.

Optionally, the buttons 73*d*, 73*e* can be correlated to fast forward and rewind functions. For example, the device 286 can be configured to fast forward through an audio file, and play the corresponding sounds at a fast forward speed, when the button 73*d* is held down and to stop and play the normal speed when the button 73*d* is released. Similarly, the device 286 can be configured to play an audio file backwards at an elevated speed, when the button 73*e* is held down, and to resume normal forward play when the button 73*e* is released. This arrangement of the buttons 73*a*, 73*b*, 73*c*, 73*d*, 73*e* provides certain advantages noted above. However, other arrangements of the buttons 73*a*, 73*b*, 73*c*, 73*d*, 73*e* and the corresponding functions thereof can be modified.

Figure 4B:
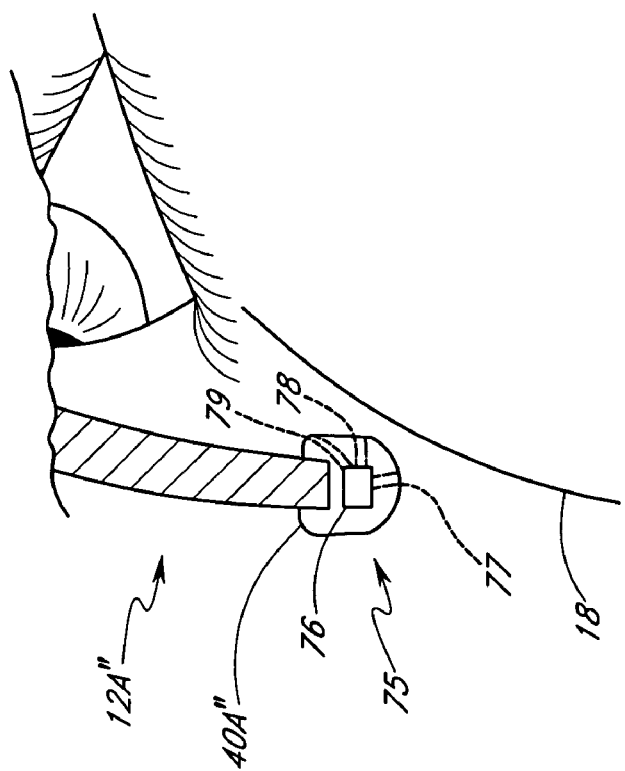
FIG. 4B is a schematic representation of a partial sectional and left side elevational view of the wearable audio device illustrated in FIG. 4A being worn a human.
Figure 4A:
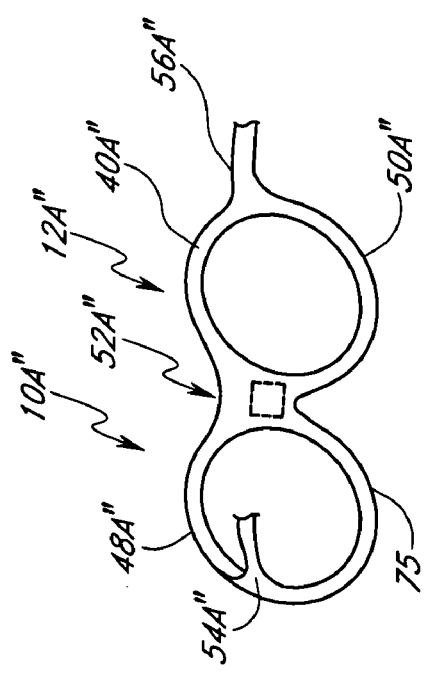
FIG. 4A is a schematic representation of a rear and left side perspective view of a further modification of the wearable audio devices illustrated in FIGS. 1, 2, and 3A–J.

With reference to FIGS. 4A–4B, a modification of the audio devices 10, 10A, 10A' is illustrated therein and referred to generally by the reference numeral 10A". The audio device 10A" can include the same components as the audio devices 10, 10A, 10A' except as noted below. Components of the audio device 10A" that are similar to corresponding components of the audio devices 10, 10A, 10A' are identified with the same reference numerals, except that a "''" has been added thereto.

The audio device 10A" is in the form of a eyeglass 12A" having a frame 40A". The audio device 10A" also includes at least one microphone 75. Advantageously, the microphone 75 is disposed so as to face toward the wearer.

FIG. 4B illustrates a partial cross-sectional view of the eyeglass 12A" on the head 18 of a wearer. The microphone 75 is schematically illustrated and includes a transducer unit 76. In the illustrated embodiment, the transducer 76 is disposed within the frame 40A" and at least one aperture 77 extends from the transducer unit 76 to the outer surface of the frame 40A". Alternatively, the transducer can be positioned so as to be exposed on the outer surface of the frame 40A".

Advantageously, the aperture 77 is disposed so as to face toward the head of the user 18. The illustrated aperture 77 faces downward and toward the head 18 of the wearer. By configuring the aperture to extend downwardly and toward the head 18, the aperture is disposed as close as possible to the mouth of the wearer while benefiting from the wind protection provided by positioning the aperture 77 on the portion of the frame 40A' facing toward the head 18.

Alternatively, the aperture can be positioned so as to extend generally horizontally from the transducer 76 to an outer surface of the frame 40A", this configuration being illustrated and identified by the numeral 78. By configuring the aperture 78 to extending generally horizontally toward the head 18, the aperture 78 is better protected from wind.

As another alternative, the aperture can be configured to extend upwardly from the transducer and toward the head 18, this configuration being identified by the numeral 79. By configuring the aperture 79 to extend upwardly from the transducer 76 and toward the head 18, the aperture 79 is further protected from wind which can cause noise. However, in this orientation, the aperture 79 is more likely to collect water that may inadvertently splash onto the aperture 79. Thus, the aperture configuration identified by the numeral 77 provides a further advantage in that water is less likely to enter the aperture 77. Any water that may enter the aperture 77 will drain therefrom due to gravity.

The microphone 75 can be disposed anywhere on the frame 40A', including the orbitals 48A", 50A", the bridge 52A", or the ear stems 54A", 56A". Optionally, the microphone 75 can be in the form of a bone conduction microphone. As such, the microphone 75 is disposed such that the when a user wears the audio device 10A', the microphone 75 is in contact with the user's head 18. For example, but without limitation, the microphone can be positioned anywhere on the anywhere on the frame 40A', including the orbitals 48A", 50A", the bridge 52A", or the ear stems 54A", 56A" such that the microphone contacts the user's head. More preferably, the microphone 75 is positioned such that it contacts a portion of the user's head 18 near a bone, such that vibrations generated from the user's voice and traveling through the bone, are conducted to the microphone. In another alternative, the microphone 75 can be configured to be inserted into the meatus 24 (FIG. 2) of the ear canal of the user. Thus, in this modification, the microphone 75 can be substituted for one of the speakers 14, 16. Alternatively, an ear-canal type bone conduction microphone can be combined with a speaker so as to provide two-way communication with the user through a single ear canal.

Further, the audio device 10A" can include noise cancellation electronics (not shown) configured to filter wind-generated noise from an audio signal transmitted from the microphone 75.

Figure 5A:
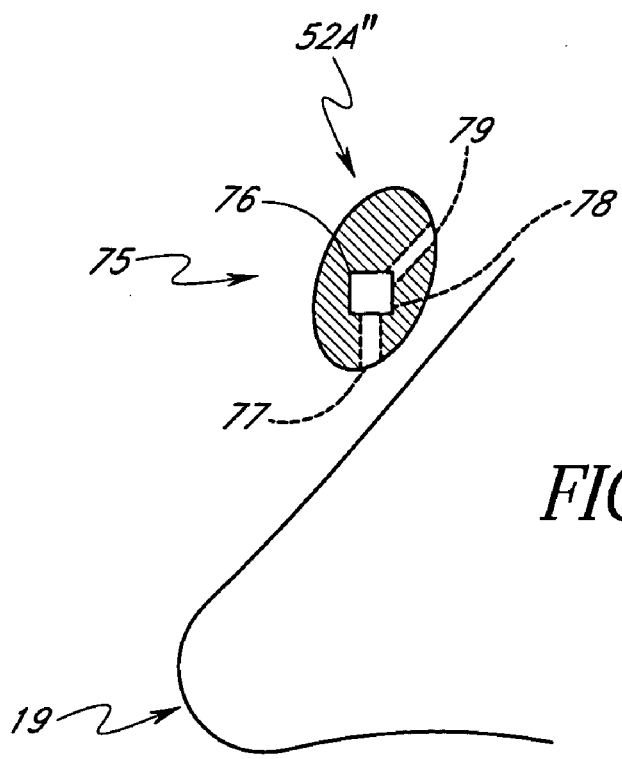
FIG. 5A is a partial sectional and side elevational view of a modification of the wearable audio device illustrated in FIG. 4A.

FIG. 5A illustrates a modification in which the microphone 75 is disposed on the bridge 52A". Similarly to the configuration illustrated in FIG. 4B, the bridge 52A" can include an aperture 77 which extends downwardly and toward the nose 19 of the wearer, horizontally extending aperture 78, or an upwardly extending aperture 79.

Figure 5B:
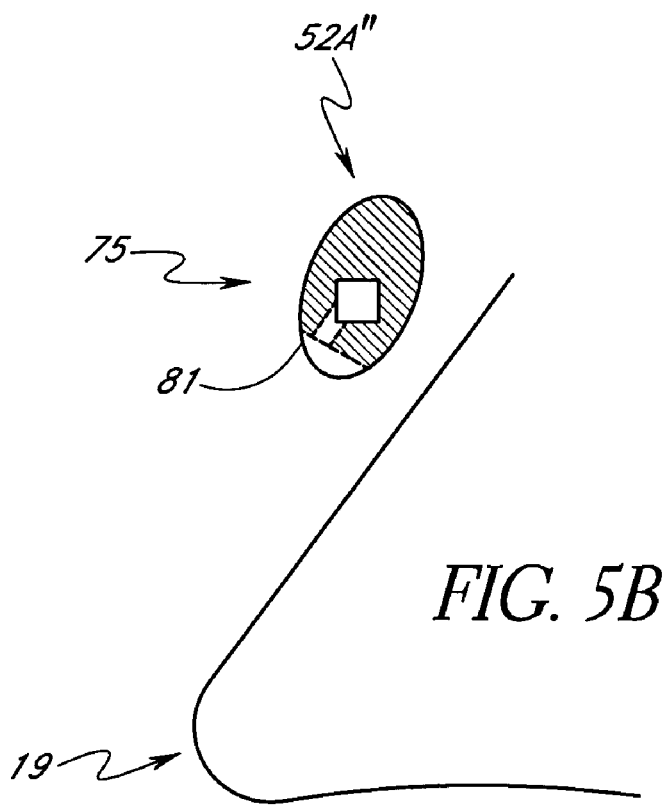
FIG. 5B is a partial sectional and side elevational view of a modification of the wearable audio device illustrated in FIG. 5A.

Alternatively, the microphone 75 can include a forwardly facing aperture, as illustrated in FIG. 5B, and a wind sock 81 disposed over the aperture. The wind sock 81 can be made in any known manner. For example, the wind sock 81 can be made from a shaped piece of expanded foam. Configuring the bridge portion 52A' as such is particularly advantageous because the bridge portion of an eyeglass is typically somewhat bulbous. A wind sock can be shaped complementarily to the bridge portion 52A'. Thus, the sock 81 can be made so as to appear to be part of a normal bridge portion of an eyeglass.

The audio device 10A" can include electrical conduits extending through the frame 40A" to an audio output jack (not shown). The audio output jack can be disposed at the end of the ear stems 54A", 56A", or anywhere else on the frame 40A". Thus, a user can wear the audio device 10A' and use the microphone 75 in order to transform the voice of the wearer or other sounds into an electrical signal. The electrical signal can be transmitted to another audio device, such as a palm top computer, a laptop computer, a digital or analog audio recorder, a cell phone, and the like. Additionally, the audio device 10A" can include speakers, such as the speakers 14A", 16A" illustrated in FIG. 3A. As such, the audio device 10A" can be configured to provide two-way audio for the wearer, i.e., audio input being transmitted to the user through the speakers 14A", 16A", and audio output being transmitted from the wearer, through the microphone 75, and out through the audio output jack. As such, a user can use the audio device 10A" for two-way audio communication in a comfortable manner.

Figure 6:
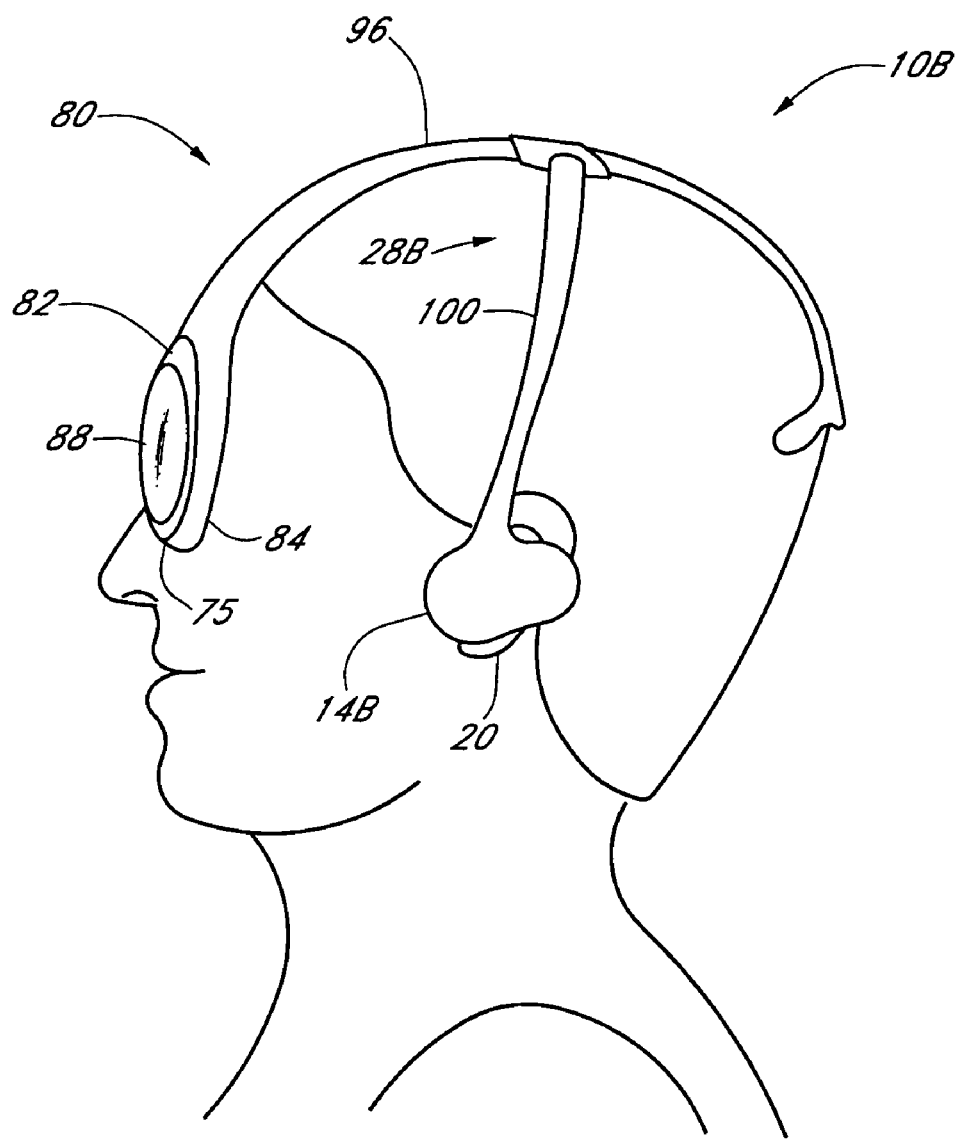
FIG. 6 is a left side elevational view of a modification of the audio device illustrated in FIGS. 3–5 being worn on the head of a user.
Figure 7:
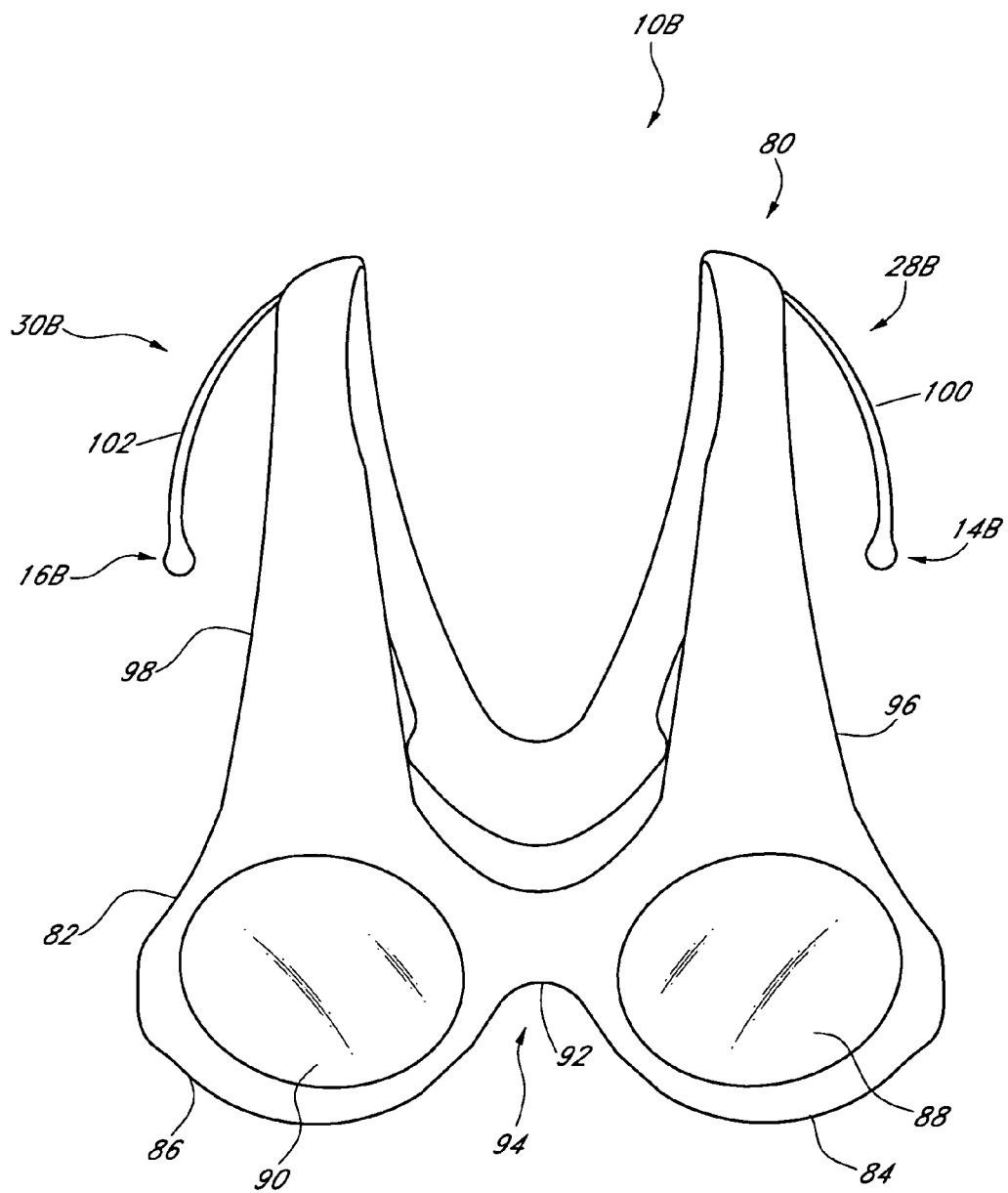
FIG. 7 is a front elevational view of the audio device illustrated in FIG. 6.

With reference to FIGS. 6 and 7, a modification of the audio devices 10, 10A, 10A', 10A" is illustrated therein and referred to generally by the reference numeral 10B. Components of the audio device 10B corresponding to components of the audio devices 10, 10A, 10A', 10A" are identified with the same reference numerals, except that letter "C" has been added thereto.

The audio device 10B is in the form of an eyeglass 80. The eyeglass 80 includes a frame 82. The frame 82 includes left and right orbitals 84, 86. Each of the orbitals 84, 86 support a lens 88, 90. The frame 82 also includes a bridge portion 92. Similarly to the bridge portion 52 of the audio device 10A, the bridge portion 92 connects the orbitals 84, 86. Additionally, the bridge portion 92 defines an open space 94 configured to receive the nose 19 of a wearer. The inner sides of the orbitals 84, 86 and/or the bridge portion 92 is configured to support the frames 82 on the nose of a user.

The eyeglass 80 also includes support stems 96, 98 extending from the upper portions of the orbitals 84, 86 toward a posterior of a wearer's head. In the illustrated embodiment, the stems 96, 98 extend along an upper surface of the wearer's head. Thus, the stems 96, 98, along with the bridge portion 92, support the eyeglass 80 on the wearer's head 18. The support members 28B, 30B are comprised of support arms 100, 102.

With reference to FIGS. 5, 6 and 7, the support arms 100, 102 extend downwardly from the stems 96, 98, respectively. In the illustrated embodiment, the support arms 100, 102 extend in an "L" shape. In particular, the support arm 100 extends from the stem 96 to a point just forward from the tragus of the user's ear 20. From this point, the support arm 100 extends rearwardly so as to support the speaker 14B at a position juxtaposed and spaced from the ear 20. Preferably, the speaker 14B is maintained in a position from about 2 mm to 3 cm from the tragus of the ear 20. Similarly to the audio device 10A, the audio device 10B can include an audio input through a wired arrangement or through a wireless transceiver.

Figure 8:
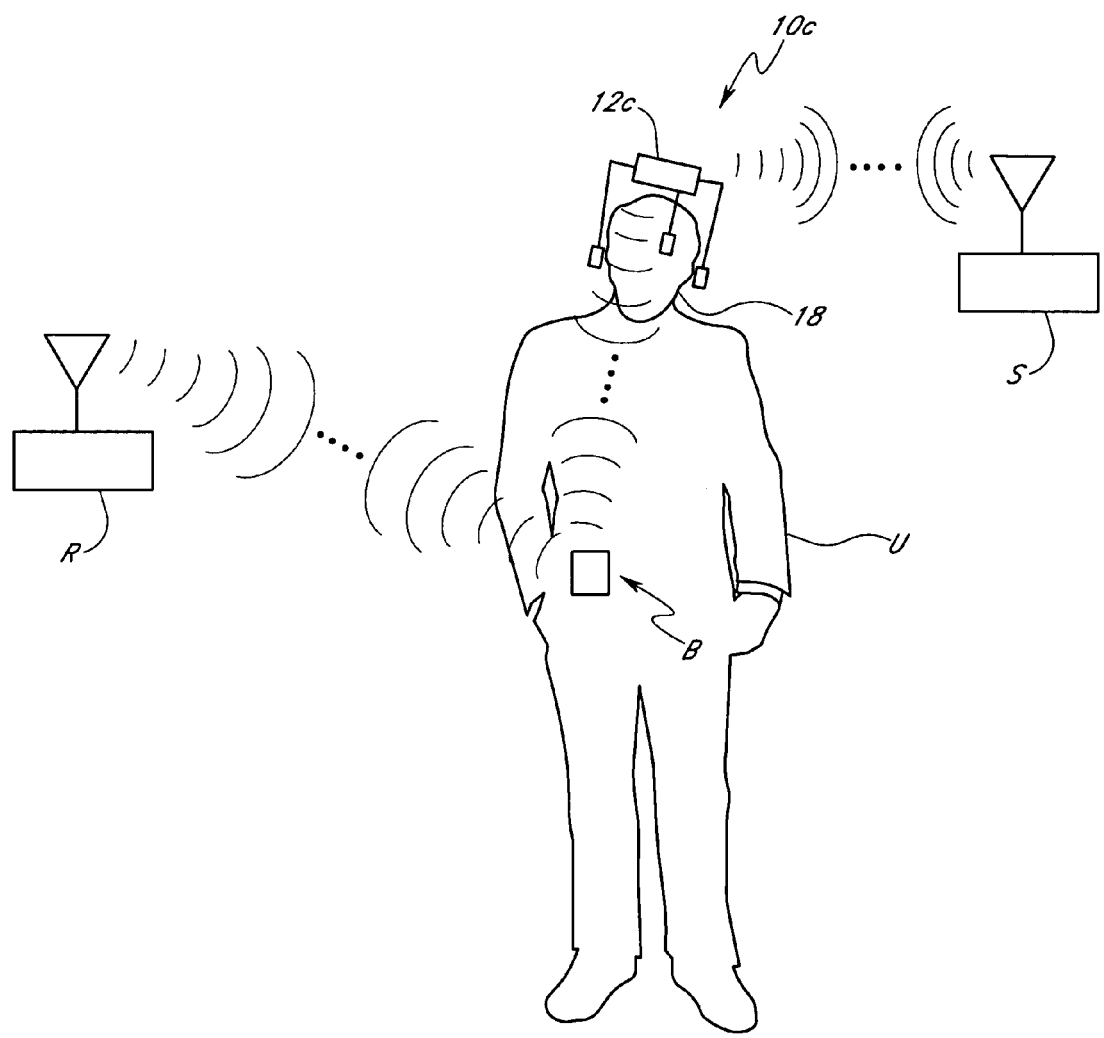
FIG. 8 is a schematic representation of a front elevational view of a further modification of the audio device illustrated in FIGS. 1 and 2 being worn by a wearer and interacting with source electronics.
Figure 9A:
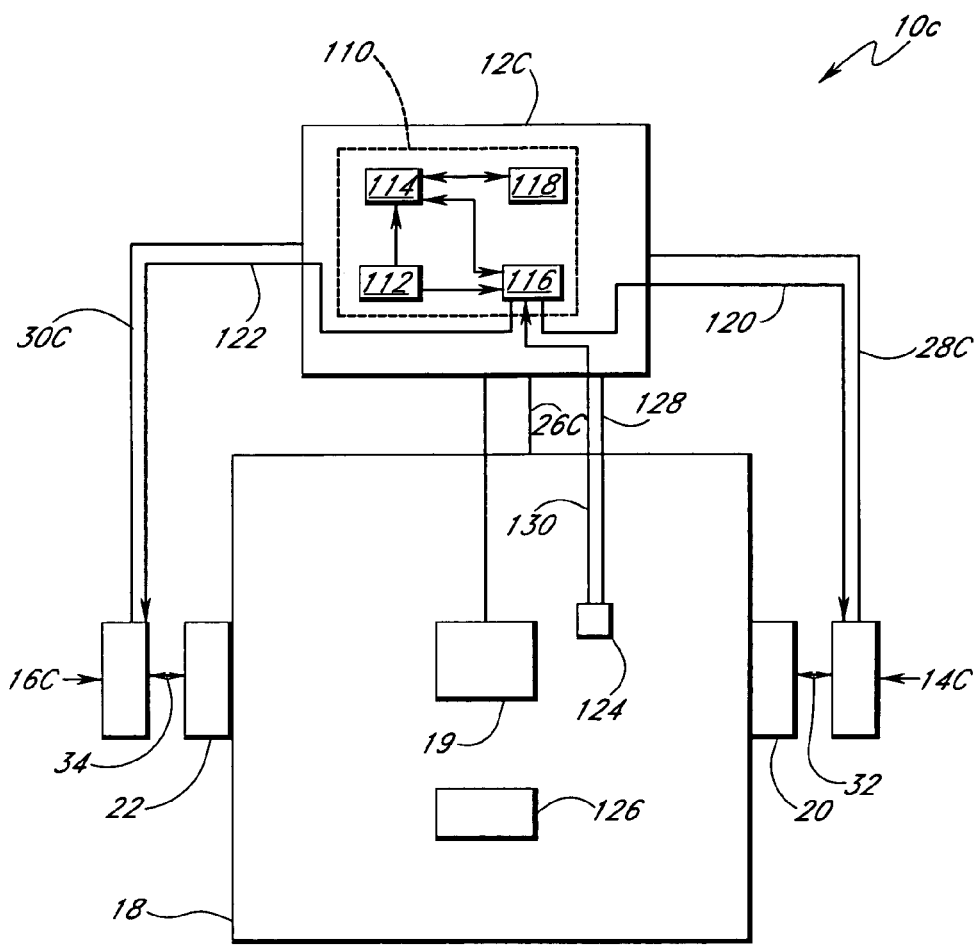
FIG. 9A is an enlarged schematic representation of a front elevational view of the audio device illustrated in FIG. 8.
Figure 9B:
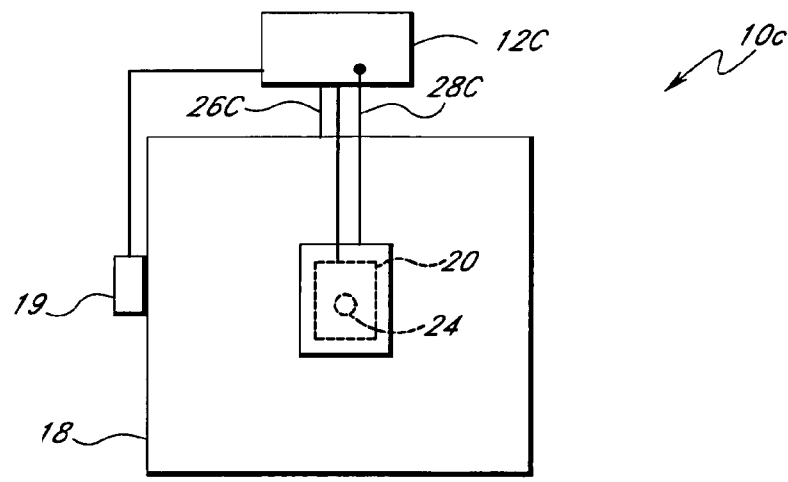
FIG. 9B is a schematic representation of a left side elevational view of the audio device illustrated in FIG. 9A.

With reference to FIGS. 8, 9A, and 9B, another modification of the audio device 10 is illustrated therein and referred to generally by the reference numeral 10C. Similar components of the audio device 10C have been given the same reference numerals, except that that a "C" has been added thereto.

As illustrated in FIG. 8, the audio device 10C can be worn on the head 18 of a user U. Preferably, the audio device 10C is configured to provide one or two-way wireless communication with a source device, or the source device can be incorporated into the audio device 10C. The source device can be carried by the user U, mounted to a moveable object, stationary, or part of a local area or personal area network.

The user U can carry a "body borne" source device B such as, for example, but without limitation, a cellular phone, an MP3 player, a "two-way" radio, a palmtop computer, or a laptop computer. As such, the user U can use the audio device 10C to receive and listen to audio signals from the source device B, and/or transmit audio signals to the source device B. Optionally, the audio device 10C can also be configured to transmit and receive data signals to and from the source device B, described in greater detail below.

Optionally, the device B can also be configured to communicate, via long or short range wireless networking protocols, with a remote source R. The remote source R can be, for example, but without limitation, a cellular phone service provider, a satellite radio provider, or a wireless internet service provider. For example, but without limitation, the source device B can be configured to communicate with other wireless data networks such as via, for example, but without limitation, long-range packet-switched network protocols including PCS, GSM, and GPRS. As such, the audio device 10C can be used as an audio interface for the source device B. For example, but without limitation, where the source device B is a cellular phone, the user U can listen to the audio output of the cellular phone, such as the voice of a caller, through sound transducers in the audio device 10C. Optionally, the user U can send voice signals or commands to the cellular phone by speaking into a microphone on the audio device 10C, described in greater detail below. Thus, the audio device 10C may advantageously be a receiver and/or a transmitter for telecommunications.

In general, the component configuration of FIG. 8 enables the audio device 10C to carry interface electronics with the user, such as audio output and audio input. However, the source electronics such as the MP3 player, cellular phone, computer or the like may be off board, or located remotely from the audio device 10C. This enables the audio device 10C to accomplish complex electronic functions, while retaining a sleek, low weight configuration. Thus, the audio device 10C is in communication with the off board source electronics device B. The off board source device B may be located anywhere within the working range of the audio device 10C. In many applications, the source electronics B will be carried by the wearer, such as on a belt clip, pocket, purse, backpack, integrated with "smart" clothing, or the like. This accomplishes the function of off loading the bulk and weight of the source electronics from the headset.

The source electronics B may also be located within a short range of the wearer, such as within the room or same building. For example, personnel in an office building or factory may remain in contact with each, and with the cellular telephone system, internet or the like by positioning transmitter/receiver antenna for the off board electronics B throughout the hallways or rooms of the building. In shorter range, or personal applications, the out board electronics B may be the form of a desktop unit, or other device adapted for positioning within relatively short (e.g. no greater than about 10 feet, no greater than about 20 feet, no greater than about 50 feet, no greater than 100 feet) of the user during the normal use activities.

In all of the foregoing constructions of the invention, the off board electronics B may communicate remotely with the remote source R. Source R may be the cellular telephone network, or other remote source. In this manner, the driver electronics may be off loaded from the headset, to reduce bulk, weight and power consumption characteristics. The headset may nonetheless communicate with a remote source R, by relaying the signal through the off board electronics B with or without modification.

Optionally, the audio device 10C can be configured to provide one or two-way communication with a stationary source device S. The stationary source device can be, for example, but without limitation, a cellular phone mounted in an automobile, a computer, or a local area network.

With reference to FIGS. 9A and 9B, the audio device 10C preferably comprises a wearable wireless audio interface device which includes a support 12C supported on the head 18 of a user by the support 26C and includes an interface device 110. The interface device 110 includes a power source 112, a transceiver 114, an interface 116, and an antenna 118.

The power source 112 can be in the form of disposable or rechargeable batteries. Optionally, the power source 112 can be in the form of solar panels and a power regulator.

The transceiver 114 can be in the form of a digital wireless transceiver for one-way or two-way communication. For example, the transceiver 114 can be a transceiver used in known wireless networking devices that operate under the standards of 802.11a, 802.11b, or preferably, the standard that has become known as BLUETOOTH™. As illustrated in BLUETOOTH™-related publications discussed below, the BLUETOOTH™ standard advantageously provides low-cost, low-power, and wireless links using a short-range, radio-based technology. Systems that employ the BLUETOOTH™ standard and similar systems advantageously allow creation of a short-range, wireless "personal area network" by using small radio transmitters. Consequently, with BLUETOOTH™-enabled systems and similar systems, components within these systems may communicate wirelessly via a personal area network. Personal area networks advantageously may include voice/data, may include voice over data, may include digital and analogue communication, and may provide wireless connectivity to source electronics. Personal area networks may advantageously have a range of about 30 feet; however, longer or shorter ranges are possible. The antenna 118 can be in the form of an onboard antenna integral with the transceiver 114 or an antenna external to the transceiver 114. In another implementation, the transceiver 114 can support data speeds of up to 721 kilo-bits per second as well as three voice channels.

In one implementation, the transceiver 114 can operate at least two power levels: a lower power level that covers a range of about ten yards and a higher power level. The higher level covers a range of about one hundred yards, can function even in very noisy radio environments, and can be audible under severe conditions. The transceiver 114 can advantageously limit its output with reference to system requirements. For example, without limitation, if the source electronics B is only a short distance from audio device 10C, the transceiver 114 modifies its signal to be suitable for the distance. In another implementation, the transceiver 114 can switch to a low-power mode when traffic volume becomes low or stops.

The interface 116 can be configured to receive signals from the transceiver 114 that are in the form of digital or analog audio signals. The interface 116 can then send the audio signals to the speakers 14C, 16C through speaker lines 120, 122, respectively, discussed in greater detail below.

Optionally, the audio device 10C can include a microphone 124. Preferably, the support 12C is configured to support the microphone 124 in the vicinity of a mouth 126 of a user. As such, the support 12C includes a support member 128 supporting the microphone 124 in the vicinity of the mouth 126.

The microphone 124 is connected to the interface 116 through a microphone line 130. Thus, the transceiver 114 can receive audio signals from the microphone 124 through the interface 116. As such, the audio device 10C can wirelessly interact with an interactive audio device, such as a cellular phone, cordless phone, or a computer which responds to voice commands. The microphone 124 can also be in any of the forms discussed above with reference to the microphone 75.

As noted above with reference to the audio device 10 in FIGS. 1 and 2, by configuring the support 12C to support the speakers 14C, 16C in a position juxtaposed and spaced from the ears 20, 22 of the head 18, the audio device 10C provides enhanced comfort for a user.

Figure 10:
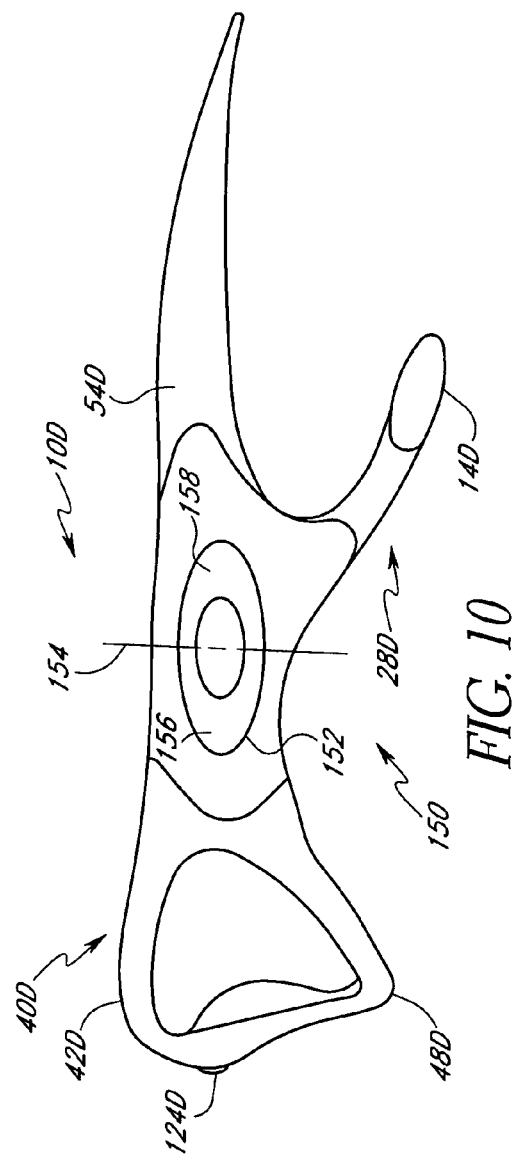
FIG. 10 is a schematic left side elevational view of a modification of the audio device illustrated in FIGS. 8 and 9A, B.
Figure 11:
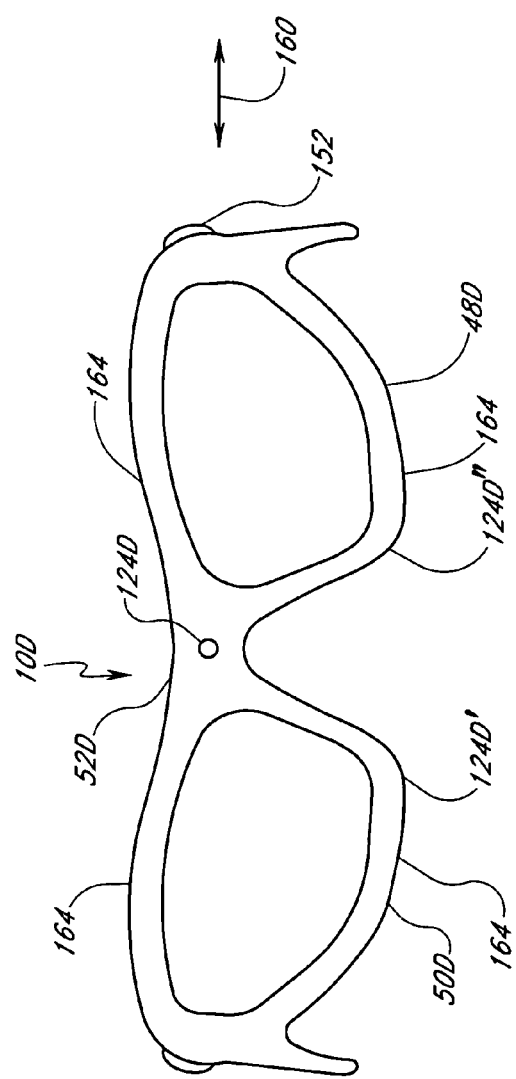
FIG. 11 is a front elevational view of the audio device illustrated in FIG. 10.
Figure 12:
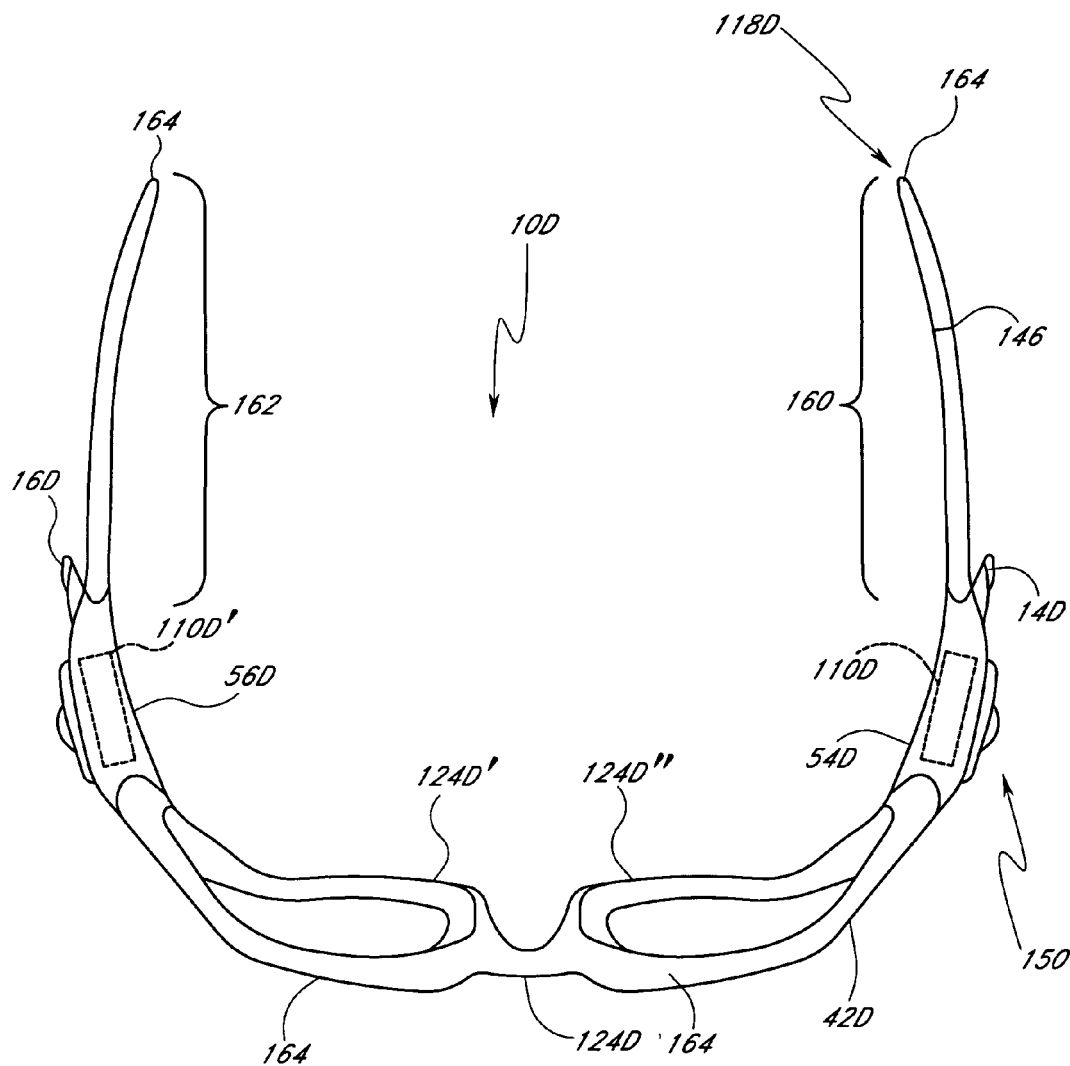
FIG. 12 is a top plan view of the audio device illustrated in FIG. 10.

With reference to FIGS. 10–12, a modification of the audio device 10C is illustrated therein and identified generally by the reference numeral 10D. The components of the audio device 10D which are the same as the components in the audio devices 10, 10A, 10B, and 10C are identified with the same reference numerals, except that a letter "D" has been added.

In the audio device 10D, the microphone 124D can be disposed in the frame 42D. In particular, the microphone 124D can be disposed in the bridge portion 52D. Alternatively, the microphone 124D can be disposed along a lower edge of the right orbital 50D, this position being identified by the reference numeral 124D'. Further, the microphone could be positioned in a lower edge of the left orbital 48D, this position being identified by the reference numeral 124D". Optionally, two microphones can be disposed on the frame 42D at both the positions 124D' and 124D". Similarly to the microphone 75, the microphones 124D', 124D" preferably are positioned so as to face toward the user. Thus, the microphones 124D', 124D" can be protected from wind and noise. The microphones 124D, 124D',124D" can also be constructed in accordance with any of the forms of the microphone 75 discussed above with reference to FIGS. 4A, 4B, 5A, 5B.

With reference to FIG. 12, the interface device 110D can be disposed in one of the ear stems 54D, 56D. Optionally, the components of the interface device 110D can be divided with some of the components being in the ear stem 54D and the remaining components in the ear stem 56D, these components being identified by the reference numeral 110D'. Preferably, the components are distributed between the ear stems 54D, 56D so as to provide balance to the device 10D. This is particularly advantageous because imbalanced headwear can cause muscle pain and/or headaches. Thus, by distributing components of the interface device 110D between the ear stems 54D, 56D, the device 10D can be better balanced.

In one arrangement, the transceiver 114, interface 116, and the antenna 118 can be disposed in the left ear stem 54D with the battery 112 being disposed in the right ear stem 56D. This arrangement is advantageous because there are numerous standard battery sizes widely available. Thus, the devices within the ear stem 54D can be balanced with the appropriate number and size of commercially available batteries disposed in the ear stem 56D.

In another arrangement, the lenses 44D, 46D can include an electronic variable light attenuation feature, such as, for example, but without limitation, a dichroic dye guest-host device. Additionally, another user operable switch (not shown) can be disposed in the ear stem 56D. Such a user operable switch can be used to control the orientation, and thus the light attenuation provided by, the dichroic dye.

Optionally, a further power source (not shown) for the dichroic dye guest-host device can also be disposed in the ear stem 56D. For example, the rear portion 162 of ear stem 56D can comprise a removable battery. Such a battery can provide a power source for controlling the orientation of the dichroic dye in the lenses 44D, 46D. In this modification, the additional user operable switch disposed in the ear stem 56D can be used to control the power from the battery supplied to the lenses 44D, 46D.

The appropriate length for the antenna 118D is determined by the working frequency range of the transceiver 114. Typically, an antenna can be approximately 0.25 of the wave length of the signal being transmitted and/or received. In one illustrative non-limiting embodiment, such as in the BLUETOOTH™ standard, the frequency range is from about 2.0 gigahertz to 2.43 gigahertz. For such a frequency range, an antenna can be made with a length of approximately 0.25 of the wavelength. Thus, for this frequency range, the antenna can be approximately 1 inch long.

With reference to FIG. 12, the antenna can be formed at a terminal end of one of the ear stems 54D, 56D. In the illustrated embodiment, the antenna 118D is disposed at the terminal end of the left ear stem 54D.

In this embodiment, approximately the last inch of the ear stem 54D is used for the antenna 118D. The antenna 118D can be made of any appropriate metal. The antenna can be connected to the transceiver 114 with a direct electrical connection, an inductive connection, or a capacitive connection.

Figure 13:
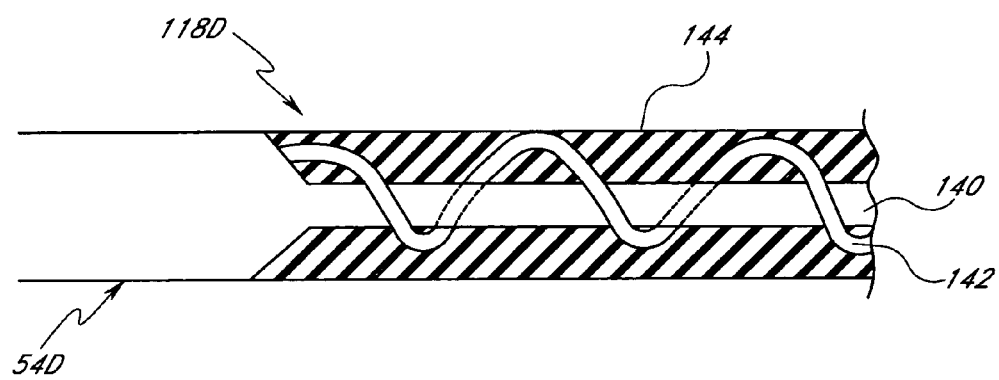
FIG. 13 is a schematic representation of a partial cross-sectional view of a portion of any of the audio devices illustrated in FIGS. 1–12.

With reference to FIG. 13, an inductive type connection is illustrated therein. As shown in FIG. 13, the antenna 118D comprises an inner conductive rod 140 and a coil 142 wrapped helically around the rod 140. The coil 142 is connected to the transceiver 114 in a known manner.

The ear stems 54D, 56D can be made from a conductive metal material. Where metal is used, near the terminal end of the ear stem 54D, the metal material is reduced relative to the outer surface of the stem 54D. The coil member is wrapped around the rod 140 and an insulative material 144 is disposed over the coil 142 so as to be substantially flush with the remainder of the ear stem 54D. Thus, the smooth outer appearance of the ear stem 54D is maintained, without comprising the efficiency of the antenna 118D.

Figure 14:
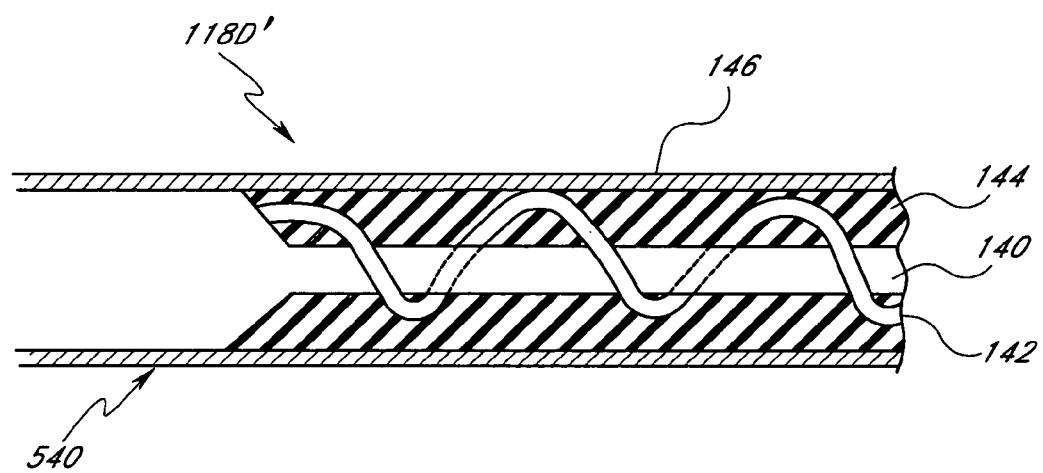
FIG. 14 is a schematic representation of a partial cross-sectional view of a modification of the portion illustrated in FIG. 13.

With reference to FIG. 14, a modification of the antenna 118D is illustrated therein and identified by the reference numeral 118D'. Components of the antenna 118D' which were the same as the antenna 118D illustrated in FIG. 13, have been given the same reference numeral, except that a "'" has been added.

The antenna 118D' and the stem 54D includes a thin outer layer 146 of a metal material. As known in the antenna arts, it is possible to dispose a thin layer of metal over an antenna without destroying the antenna's ability to transmit and receive signals. This design is advantageous because if the device 10D is constructed of a metal material, including metal such as, for example, without limitation, sintered titanium or magnesium, the thin outer layer 146 can be formed of this material so that the appearance of the device 10D is uniform.

Where the stem 54D is made from a metal material, the antennas 118D, 118D' illustrated in FIGS. 13 and 14 provide an additional advantage in that electrons in the ear stem 54D can be excited by the signal applied to the coil 142. Thus, the ear stem 54D itself becomes part of the antenna 118D, 118D', and thus can provide better range and/or efficiency for the transmission and reception of signals. Furthermore, if the ear stem 54D is electrically coupled to the frame 42D, the frame 42D would also become excited in phase with the excitations of the antenna 118D, 118D'. Thus, the ear stem 54D and the frame 42D would effectively become part of the antenna, thereby allowing transmission and reception from two sides of the head of the user.

Optionally, the ear stem 56D could also be electrically coupled to the frame 42D. Thus, the stem 56D would also become part of the antenna 118D, 118D', thereby allowing transmission and reception of signals on three sides of the user's head. Thus, where at least a portion of a frame of an eyeglass is used as the antenna for the wireless transceiver 114, the audio device benefits from enhanced antenna efficiency.

Optionally, the antenna 118D, 118D' can be isolated from the remainder of the stem 54D via an insulator 146, thereby preventing interference between the antenna and other devices on the audio device 10D. As such, the remainder of the device 10D can be made from any material, such as, for example, but without limitation, a polymer.

Preferably, the audio device 10D includes a user interface device 150 configured to transmit user input signals to the interface 116 and/or the transceiver 114. In the illustrated embodiment, the user interface device 150 is in the form of a 3-way button. The 3-way button 152 is configured to have three modes of operation. Firstly, the button 152 is mounted to pivot about a rocker axis 154. Thus, in one mode of operation, the button 152 can be depressed inwardly on a forward end 156 of the button 152, thereby causing the button 152 to pivot or "rock" about the pivot axis 154. Additionally, the button 152 can be pressed at a rearward end 158, thereby causing the button 152 to pivot about the pivot axis 154 in the opposite direction. Additionally, the button 152 can be mounted so as to be translatable in the medial-lateral direction, identified by the reference numeral 160 (FIG. 11). Appropriate springs can be provided beneath the button 152 to bias the button in an outward protruding and balanced position. Appropriate contacts can be mounted beneath the button 152 so as to be activated individually according to the modes of operation.

In one illustrative and non-limiting embodiment, the button 152 can be used to control volume. For example, by pressing on the forward portion 156, a contact can be made causing the transceiver 114 or the interface 116 to increase the volume of the speakers 14D, 16D. Additionally, by pressing on the rearward portion 158 of the button 152, the transceiver 114 or interface 116 could lower the volume of the speakers 14D, 16D.

In a further illustrative and non-limiting example, the medial-lateral movement of the button 152, along the directions identified by the arrow 160, can be used to choose different functions performed by the transceiver 114 or the interface 116. For example, an inward movement of the button 152 could be used to answer an incoming phone call where the audio device 10D is used as an audio interface for a cellular phone.

Optionally, the power source 112 can comprise portions of the ear stems 54D, 56D which have been formed into batteries. For example, the rear portions 160, 162 of the ear stems 54D, 56D, respectively, can be in the form of custom made batteries, either disposable or rechargeable. Preferably, the rear portions 160, 162 are removable from the forward portions of the ear stems 54D, 56D. This provides a particular advantage in terms of balance. As noted above, imbalanced loads on the head can cause muscular pain and/or headaches. In particular, excessive pressure on the nose can cause severe headaches. Additionally, batteries can have a significantly higher mass density than plastic and lightweight metals, such as sintered titanium or magnesium. Thus, by constructing the rearward portions 160, 162 of the ear stems 54D, 56D of batteries, the weight of these batteries can improve forward-rearward balance of the audio device 10D in that the weight of the interface device 110 can be offset by the batteries. In another embodiment, the ear stems 54D, 56D can define a housing for removable batteries.

The audio device 10D can also include power contacts 164 for recharging any rechargeable batteries connected thereto. For example, the power contacts 164 can be disposed on a lower edge of the orbitals 48D, 50D. Thus, with an appropriate recharging cradle (not shown), the audio device 10D can be laid on the cradle, thereby making contact between the power contacts 164 and corresponding contacts in the cradle (not shown). Alternatively, power contacts can be provided in numerous other locations as desired. For example, the power contacts 164 can be disposed at the ends of the ear stems 54D, 56D. A corresponding cradle can include two vertically oriented holes into which the ear stems are inserted for recharging. In this configuration, the lens within the orbitals 48D, 50D would face directly upwardly.

In another alternative, the power contacts 164 are disposed on the upper edges of the orbitals 48D, 50D. In this configuration, the audio device 10D is laid in a cradle in an inverted position, such that the contacts 164 make electrical contact with corresponding contacts in the cradle. This position is advantageous because it prevents weight from being applied to the supports 28D, 30D. This prevents misalignment of the speakers 14D, 16D.

With reference to FIGS. 8, 9A, and 9B, in another embodiment, the audio device 10C is advantageously adapted to support any of a variety of portable electronic circuitry or devices which have previously been difficult to incorporate into conventional headsets due to bulk, weight or other considerations. For example, but without limitation, the electronics are digital or other storage devices and retrieval circuitry such as for retrieving music or other information from MP3 format memory or other memory devices. The audio device 10C can carry any of a variety of receivers and/or transmitters, such as transceiver 114. For example, but without limitation, the audio device 10C can carry receivers and/or transmitters for music or for global positioning. In another example, the audio device 10C can carry receivers and/or transmitters for telecommunications (i.e., telecommunications devices). As used herein, the term "telecommunications devices" is intended to include telephone components as well as devices for communicating with a telephone. For example, "telecommunications devices" can include one or more transceivers for transmitting an audio signal to a cellular phone to be transmitted by the cellular phone as the speaker's voice, and/or for receiving an audio signal from a cellular phone representing a caller's voice. Of course, other audio, video, or data signals can be transmitted between the audio device 10C and such a cellular phone through such transceivers.

In other embodiments, drivers and other electronics for driving heads-up displays, such as liquid crystal displays or other miniature display technology can also be carried by the audio device 10C. The power source 112 can be carried by the audio device 10C. For example, without limitation, the power source 112 can advantageously be replaceable or rechargeable. Other electronics or mechanical components can additionally be carried by the audio device 10C. In other embodiments, the audio device 10C can also be utilized solely to support any of the foregoing or other electronics components or systems, without also supporting one or more lenses in the wearer's field of view. Thus, in any of the embodiments of the audio devices disclosed herein, the lenses and/or lens orbitals can be omitted as will be apparent to those of skill in the art in view of the disclosure herein.

In another embodiment, a further modification of the audio devices 10, 10A, 10B, 10C, and 10D is provided wherein the audio devices include at least two banks of microphones, with one bank acting as a speaker of received and one bank providing an ambient noise-cancellation function. The microphone banks can be positioned at any suitable location or combination of locations (e.g., on the audio device, within the audio device, opposing sides of the audio device, or the like). In one embodiment, automatic switching of the speaking-microphone and noise-canceling-microphone banks' functions advantageously enhances ease of use. In a further embodiment, the microphone banks can be arranged in an array to be used in conjunction with algorithms to discern, reduce, and/or eliminate noise for the purpose of voice recognition. For example, in one embodiment, such microphone banks can include ASIC-based noise-canceling technology, such as is available in chips from Andrea Electronics Corporation (AEC), to enable voice recognition in ambient noise up to about 130 Db or more. In another embodiment, microphone banks can be arranged in any suitable combination of linear or non-linear arrays to be used in conjunction with algorithms to discern, reduce, and/or eliminate noise in any suitable manner. In another embodiment, audio/proximity sensors can advantageously trigger the appropriate functionality in a specific bank. In another embodiment, a noise-canceling microphone can be provided in connection with a cord or other microphones described above. For example, without limitation, a series of miniature microphones can be supported down a cord from the audio device, separated by desired distances, and aimed in different directions. In another implementation, one or more of the microphones can be for verbal input from the user, and one or more others of the microphones, or the same microphone, can also be for noise-cancellation purposes.

With reference to FIGS. 8, 9A, and 9B, in another embodiment, the transceiver 114 is adapted to employ a wide variety of technologies, including wireless communication such as RF, IR, ultrasonic, laser or optical, as well as wired and other communications technologies. In one embodiment, a body-LAN radio is employed. Other embodiments can employ a flexible-circuit design. Many commercially available devices can be used as transceiver 114. For example, without limitation, Texas Instruments, National Semiconductor, Motorola manufacture and develop single RF transceiver chips, which can use, for example, 0.18 micron, 1.8 V power technologies and 2.4 GHz transmission capabilities. Of course, a variety of transceiver specifications are available and usable, depending on the particular embodiment envisioned. In another implementation, other commercially available products operating at 900 MHz to 1.9 GHz or more can be used. Data rates for information transfer to wearable or other type computing devices will vary with each possible design. In a preferred implementation, a data rate is sufficient for text display. RF products, and other products, ultimately will be capable of updating a full-color display and have additional capabilities as well. Thus, heads-up displays, such as liquid crystal displays or other miniature display technology described above can be employed.

In another embodiment, a further modification of the audio devices 10, 10A, 10B, 10C, and 10D is provided wherein the audio devices can include and/or communicate with a variety of sensors, including but not limited to motion, radar, heat, light, smoke, air-quality, oxygen, CO and distance. Medical monitoring sensors are also contemplated. Sensors can be directed inwardly toward the user's body, or outwardly away from the body (e.g., sensing the surrounding environment). Sensors in communication with the audio devices also can be strategically positioned or left behind to facilitate the communication of sensed information. For example, a firefighter entering a burning building can position sensor to communicate the smoke and heat conditions to that firefighter and to others at the sensor-drop location. Remote sensors can also be relatively fixed in position, as in the case of a maintenance worker wearing an audio device that receives various signals from sensors located in machines or other equipment for which the worker is responsible. A blind wearer of audio device can employ a distance sensor to determine distance to surrounding objects, for example, or a GPS unit for direction-finding. Other exemplary sensing capabilities are disclosed on one or more of the following, all of which are incorporated by reference herein: U.S. Pat. No. 5,285,398 to Janik, issued Feb. 9, 1994; U.S. Pat. No. 5,491,651 to Janik, issued Feb. 13, 1996; U.S. Pat. No. 5,798,907 to Janik, issued Aug. 25, 1998; U.S. Pat. No. 5,581,492 to Janik, issued Dec. 3, 1996; U.S. Pat. No. 5,555,490 to Carroll, issued Sep. 10, 1996; and U.S. Pat. No. 5,572,401 to Carroll, issued Nov. 5, 1996.

Figure 15:
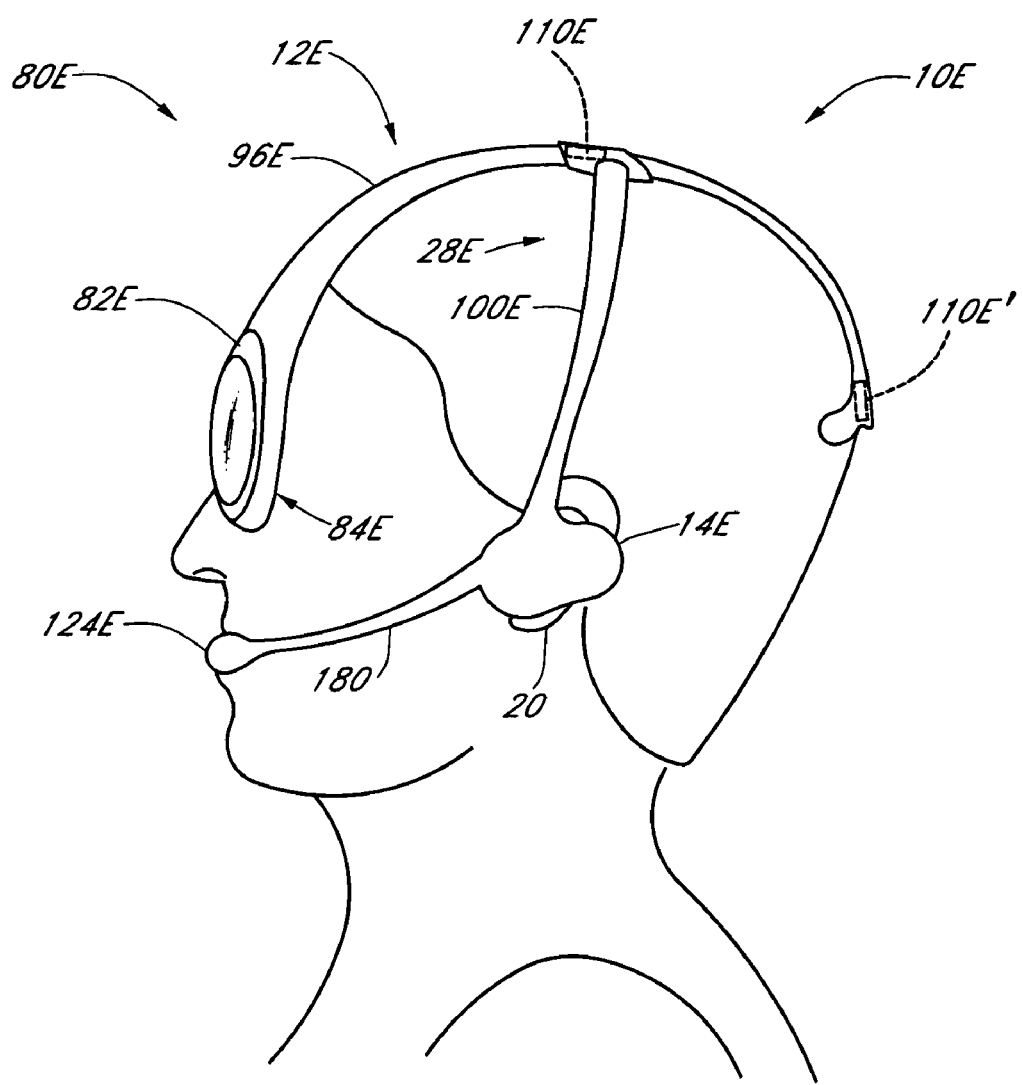
FIG. 15 is a left side elevational view of a modification of the audio devices illustrated in FIGS. 8–12.
Figure 16:
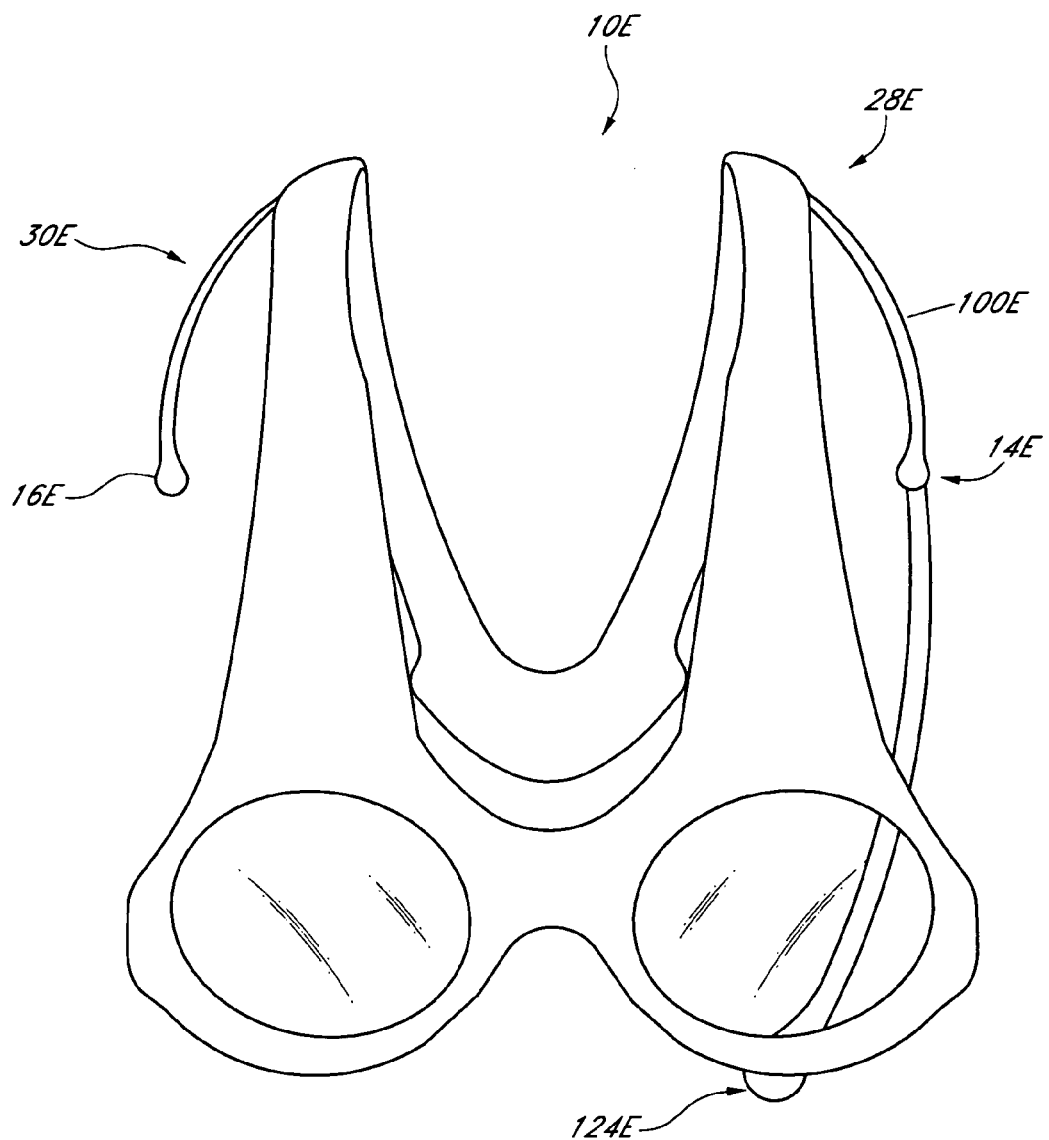
FIG. 16 is a front elevational view of the audio device illustrated in FIG. 15.

With reference to FIGS. 15 and 16, a further modification of the audio devices 10, 10A, 10B, 10C, and 10D, is illustrated therein and identified generally by the reference numeral 10E. Components that are similar or the same as the components of the audio devices 10, 10A, 10B, 10C, and 10D, have been given the same reference numerals, except that a "E" has been added thereto.

The audio device 10E includes a microphone boom 180 extending downwardly from the lower end of the support arm 100E. The microphone 124E is disposed at the lower end of the microphone boom 180.

In the illustrated embodiment, the audio device 10E can include the interface device 110E at an upper portion of the stem 96E. In particular, the interface device 110E can be disposed at the point at which the support arm 100E connects to the stem 96E. Optionally, certain components of the interface device 110E can be disposed at a rear portion of the stem 96E, this position being identified by the reference numeral 110E'.

In this embodiment, the antenna 118E can be disposed in the frame 82E, the stem 96E, the support arm 100E, or the microphone boom 180E. However, as noted above, it is preferable that at least a portion of the support 12E is used as the antenna. More preferably, the support 12E is made from a metal material, such that at least a portion of the support 12E is excited by the antenna and thereby forms part of the antenna.

The transceiver 114 can be in the form of a digital wireless transceiver for one-way or two-way communication. For example, the transceiver 114 can be configured to receive a signal from another transmitter and provide audio output to the speakers 14, 14A, 14B, 14C, 14D, 14E, 16, 16A, 16B, 16C, 16D, 16E. Alternatively, the transceiver 114 can be configured to receive an analog audio signal from microphone 75, 124, 124D, 124E, convert the signal to a digital signal, and transmit the signal to another audio device, such as, for example, but without limitation, a cell phone, a palm top computer, a laptop computer or an audio recording device.

The over-the-head configuration of the audio device 10E advantageously allows distribution of the load across a wearer's head, as well as positioning of relatively bulky or heavy electronics along the length of (i.e., inside) the audio device 10E or at the posterior aspect of the audio device 10E such as at the occipital end of the audio device 10E. This enables the audio device 10E to carry electronic equipment in a streamlined fashion, out of the wearer's field of view, and in a manner which distributes the weight across the head of the wearer such that the eyewear tends not to shift under the load, and uncomfortable pressure is not placed upon the wearer's nose, ears or temple regions.

In this embodiment, additional functional attachments may be provided as desired anywhere along the length of the frame, lenses or orbitals of the audio device 10E. For example, earphones may be directed towards the wearer's ear from one or two earphone supports extending rearwardly from the front of the eyeglass, down from the top of the audio device 10E or forwardly from the rear of the audio device 10E. Similarly, one or more microphones may be directed at the wearer's mouth from one or two microphone supports connected to the orbitals or other portion of the audio device 10E.

With reference to FIGS. 17 and 18, a communication protocol between the audio device S, B and the transceiver 114 is described. In this embodiment, the transceiver 114 is configured for one-way communication. The transceiver includes a receiver and decoder 202 and a digital-to-audio converter 204.

As noted above with reference to FIG. 8, the audio device S, B can be any one of a number of different audio devices. For example, but without limitation, the audio device S, B can be a personal audio player such as a tape player, a CD player, a DVD player, an MP3 player, and the like. Alternatively, where the transceiver 114 is configured only to transmit a signal, the audio device S, B can be, for example, but without limitation, an audio recording device, a palm top computer, a laptop computer, a cell phone, and the like.

For purposes of illustration, the audio device S, B will be configured only to transmit a signal to the transceiver 114. Thus, in this embodiment, the audio device S, B includes an MP3 player 206 and an encoder and transmitter 208. An antenna 210 is illustrated schematically and is connected to the encoder and transmitter 208. As an illustrative example, the MP3 player 206 outputs a signal at 128 kbps (NRZ data). However, other data rates can be used. The encoder and transmitter 208 is configured to encode the 128 kbps signal from the MP3 player and to transmit it through the antenna 210. For example, the encoder and transmitter 208 can be configured to transmit the encoded signal on a carrier signal centered on 49 MHz.

The receiver and decoder 202 can be configured to receive the carrier signal of 49 MHz through the antenna 118, decode the digital signal, and transmit the digital signal to the digital-to-audio converter 204. The digital-to-audio converter 204 can be connected to the speakers 14,16 and thereby provide an audio output that is audible to the user.

With reference to FIG. 18, the 128 kbps signal from the MP3 player 206 is identified by the reference numeral 212. In one embodiment, the encoder and transmitter 208 can be configured to encode the signal 212 from the MP3 player 206. The encoded signal from the encoder and transmitter 208 is identified by reference numeral 216.

The encoder and transmitter 208 can be configured to encode each pulse 214 of the signal 212 into a pattern of pulses, one pattern being identified by the reference numeral 218.

In the lower portion of FIG. 18, signal 220 represents an enlarged illustration of the portion of the signal 216 identified by a circle 222. As shown in FIG. 18, the pattern 218 is comprised of a series of 50 MHz and 48 MHz signals.

Figure 19:
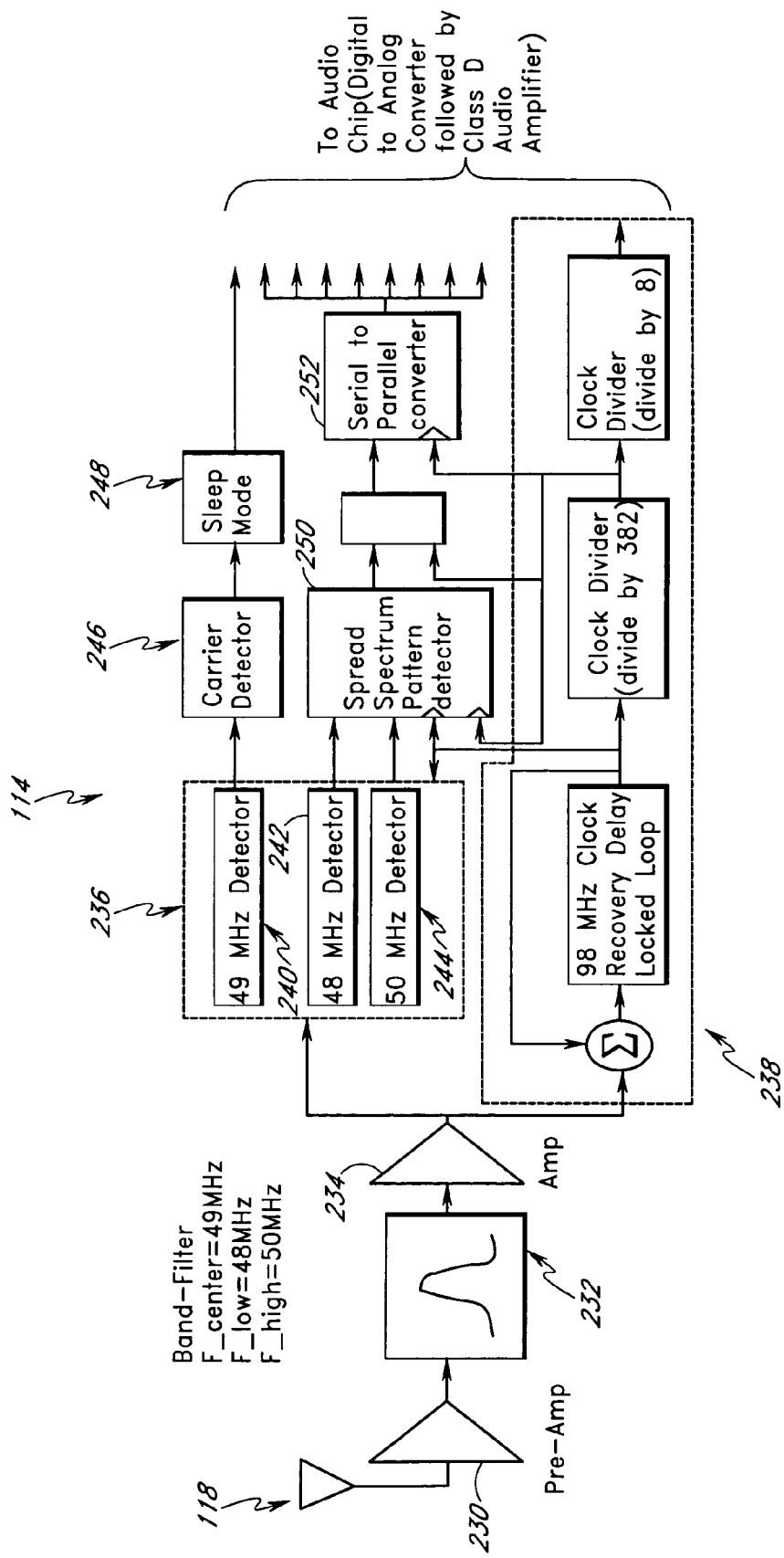
FIG. 19 is a schematic illustration of the decoder illustrated in FIG. 17.

With reference to FIG. 19, a more detailed illustration of the transceiver 114 is illustrated therein. As shown in FIG. 19, the transceiver includes a preamplifier 230, a band pass filter 232, and an amplifier 234 connected in series. The preamplifier 230 and the amplifier 234 can be of any known type, as known to those of ordinary skill in the art. The band filter 232, in the present embodiment, can be constructed as a band pass filter, allowing signals having a frequency from 48 MHz to 50 MHz, inclusive, to pass therethrough. Alternatively, the band filter 232 can be comprised of three band pass filters configured to allow frequencies centered on 48 MHz, 49 MHz, and 50 MHz, respectively, pass therethrough.

The transceiver 114 also includes a signal detector 236 and a system clock circuit 238. The signal detector 236 comprises three signal detectors, i.e., a 49 MHz detector 240, a 48 MHz detector 242 and a 50 MHz detector 244. The 49 MHz detector 240 is connected to a carrier detector 246. As is schematically illustrated in FIG. 19, when the signal detector 236 detects a 49 MHz signal, which corresponds to a state in which no audio signal is being transmitted from the MP3 player 206, the carrier detector 246 causes the transceiver 114 to enter a sleep mode, schematically illustrated by the operation block 248.

As the detectors 242, 244 detect 48 MHz and 50 MHz detectors, respectively, they output signals to a spread spectrum pattern detector 250. The spread spectrum pattern detector outputs a corresponding signal to a serial-to-parallel converter 252. The output of the serial-to-parallel converter 252 is output to a digital-to-analog converter 204. A "class D" audio amplifier (not shown), for example, but without limitation, can be connected to the output of the digital-to-audio converter 204 to thereby supply an audio signal to the speakers 14, 14A, 14B, 14C, 14D, 14E, 16, 16A, 16B, 16C, 16D, 16E. It is to be noted that the encoding performed by the encoder and transmitter 208 can be in accordance with known signal processing techniques, such as, for example, but without limitation, CDMA, TDMA, FDM, FM, FSK, PSK, BPSK, QPSK, M-ARYPSK, MSK, etc. In this embodiment, the transceiver 114 can operate with a single channel.

Figure 20:
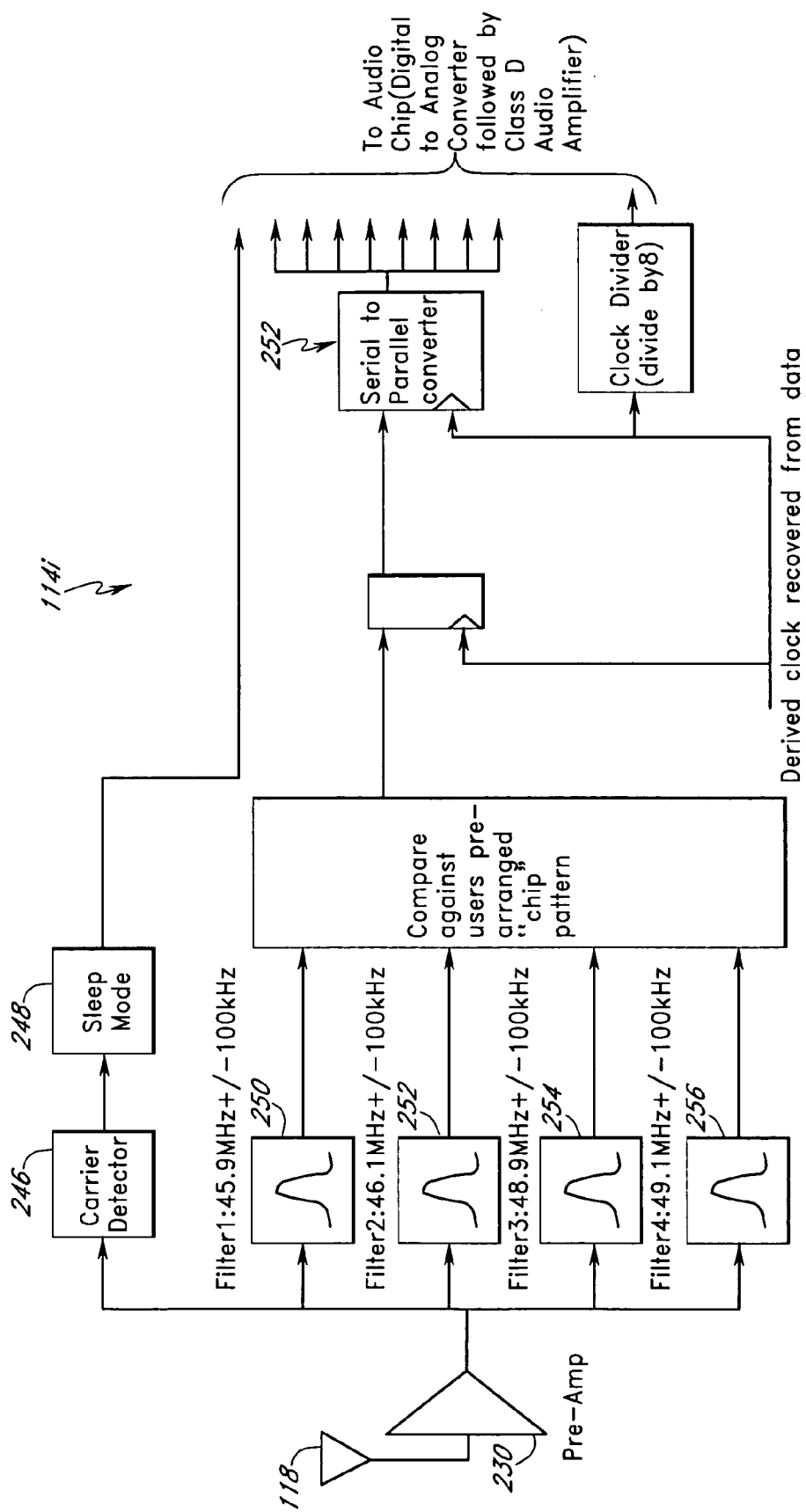
FIG. 20 is a schematic illustration of a modification of the decoder illustrated in FIG. 19, which can be incorporated into any of the wearable audio devices illustrated in FIGS. 1–16.

With reference to FIG. 20, a dual channel transceiver 114i is schematically illustrated therein. In this modification, the transceiver 114i is configured to simultaneously receive two signals, one signal centered on 46 MHz, and a second signal centered on 49 MHz. Thus, the transceiver 114i includes four band-pass filters. The first filter 250 is configured to allow a signal at 45.9 MHz plus or minus 100 kHz to pass therethrough. A second filter 252 is configured to allow signals at 46.1 MHz plus or minus 100 kHz to pass therethrough. The third filter 254 is configured to allow signals at 48.9 MHz plus or minus 100 kHz to pass therethrough. A fourth filter 256 is configured to allow signals at 49.1 MHz plus or minus 100 kHz to pass therethrough. As such, the transceiver 114 can receive two simultaneous signals, as noted above, one being centered at 46 MHz and one being centered at 49 MHz. Thus, this modification can be used to receive two audio signals simultaneously, for example, left and right signals of the stereo audio signal.

Each of the transceivers 114, 114i, illustrated in FIGS. 17–20, can be configured to receive one pattern 218, a plurality of different signals 218 or only one unique pattern 218. Additionally, as known in the art, the transceiver 114 or 114i and the encoder 208 can include pseudo random generators which vary the pattern 218 according to a predetermined sequence. Thus, the receiver and decoder 202 can be configured to auto synchronize by recognizing a portion of the predetermined sequence.

In an application where the transceiver 114 operates according to the BLUETOOTH™ standards, the transceiver 114 communicates with the transmitter according to a spread spectrum protocol so as to establish communication in a short range wireless environment with the minimal risk of interference with other devices. For example, the transceiver 114 can communicate with a BLUETOOTH™ enabled MP3 player, or other audio device. The audio device 10C can receive the output signal from the BLUETOOTH™ enabled MP3 player, and then output the audio signals to the interface 116. Optionally, the signal can be a stereo signal. The interface 116 can then direct the left and right audio signals to the speakers 14, 14A, 14B, 14C, 14D, 14E, 16, 16A, 16B, 16C, 16D, 16E through the speaker lines 120, 122.

In accordance with the BLUETOOTH™ standard, for example, but without limitation, the transceiver 114 can operate in a half duplex mode in which signals are transmitted in only one direction. For example, at any one moment, the transceiver 114 can only either receive signals and direct them to the speakers 14, 14A, 14B, 14C, 14D, 14E, 16, 16A, 16B, 16C, 16D, 16E or transmit signals, for example, from the microphone 75, 124, 124D, 124E to another device through the antenna 118, 118D, 118D'. Alternatively, the transceiver 114 can be configured to operate in a full duplex mode in which simultaneous of audio signals are received and transmitted to the speakers 14, 14A, 14B, 14C, 14D, 14E, 16, 16A, 16B, 16C, 16D, 16E and simultaneously audio signals from the microphone 75, 124, 124D, 124E are transmitted through the antenna 118, 118D, 118D' to a cooperating wireless device.

Further, the interface 116 can include a processor and a memory for providing added functionality. For example, the interface 116 can be configured to allow a user to control the cooperating wireless device, such as a cell phone. In an illustrative, non-limiting embodiment, where the transceiver 114 is a BLUETOOTH™ device, the interface 116 can be configured to support a hands-free protocol, as set forth in the BLUETOOTH™ hands-free protocol published Oct. 22, 2001, the entire contents of which is hereby expressly incorporated by reference. Optionally, the interface 116 can be configured to comply with other protocols such as, for example, but without limitation, general access profile, service discovery application profile, cordless telephony profile, intercom profile, serial port profile, headset profile, dialup networking profile, fax profile, land access profile, generic object exchange profile, object push profile, file transfer profile, and synchronization profile, published Oct. 22, 2001, the entire contents of each of which being hereby expressly incorporated by reference. Additionally, the "Specification of the Bluetooth System, Core", version 1.1, published Feb. 22, 2001 is hereby expressly incorporated by reference.

The headset profile is designed to be used for interfacing a headset having one earphone, a microphone, and a transceiver worn by the wearer, for example, on a belt clip, with a cordless phone through a wireless connection. According to the headset profile, certain commands can be issued from a headset, such as the audio devices 10, 10A, 10A', 10B, 10C, 10D, and 10E, using an AT command protocol. In such a protocol, text commands must be input to the BLUETOOTH™ device, which the BLUETOOTH™ device then transmits wirelessly to a synchronized BLUETOOTH™ enabled device. Such commands include, for example, but without limitation, initiating a call, terminating a call, and redialing a previously dialed number.

With reference to FIG. 9A, the interface electronics 116 can include audio or "aural" menus that can be selected by user. For example, a user can initiate an audio menu by depressing the button 150 (FIGS. 10–12). Upon initiation of the audio menus, the interface electronics 116 can send an audio signal to the speakers 14, 14A, 14B, 14C, 14D, 14E, 16, 16A, 16B, 16C, 16D, 16E including a humanoid voice. The voice signal can indicate that a first menu option is available. For example, but without limitation, the first menu choice can be to initiate a call. Thus, when the user pushes the button 150 the first time, the user will hear the words "initiate a call," emanating from the speakers 14, 14A, 14B, 14C, 14D, 14E, 16, 16A, 16B, 16C, 16D, 16E. If the user wishes to initiate a call, the user can depress the button 150 again which will send the appropriate AT command to the transceiver 114 so as to transmit the proper AT code to the cellular phone source device S, B (FIG. 8).

The user can be provided with further convenience if there are other menu choices available, for example, if the user does not wish to choose the first menu option, the user can depress either the forward or rearward portions 156, 158 of the button 150 so as to "scroll" through other audio menu options. For example, other audio menu options can include, for example, but without limitation, phonebook, email, clock, voice commands, and other menu options typically available on cellular phones and/or personal audio devices such as MP3 players.

As an illustrative, but non-limiting example, if a user wishes to access the phonebook, the user can depress the button 150 to initiate the audio menu, then "scroll" to the phonebook by depressing the portions 156 or 158 until the user hears the word "phonebook" in the speakers 14, 14A, 14B, 14C, 14D, 14E, 16, 16A, 16B, 16C, 16D, 16E. Once the user hears the word "phonebook," the user can depress the button 150 again to enter the phonebook. Thereafter, the user can depress the portions 156, 158 to "scroll" through phonebook entries. As the user scrolls through the phonebook entries, the interface 116 can be configured to cause the cellular phone to scroll through the phonebook and thereby transmit an audio signal of a humanoid voice indicating entries in the phonebook. When the user hears the name of the person or entity which the user desires to call, the user can again push the button 150 to initiate a call to that entity.

In this embodiment, the cell phone can be configured with a text-to-voice speech engine which generates a humanoid voice corresponding to entries of the phonebook. Such speech engines are known in the art and are not described further herein.

A text-to-speech engine can provide further convenient uses for a user. For example, if the cell phone or other source device is configured to receive email, the device can be configured to signal the user with an audio signal that an email has been received. The user can send a signal to the source device so as to open the email. The text-to-speech engine can be configured to read the email to the user. Thus, a user can "listen" to email through the audio device 10, 10A, 10A', 10B, 10C, 10D, 10E, without manually operating the source device.

A further option is to allow a user to respond to such an email. For example, the user could record an audio file, such as, for example, but without limitation a .WAV, .MP3 file as an attachment to a reply email. For such a feature, the interface 116 can be configured to automatically provide a user with options at the end of an email that is read to the user. For example, after the text-to-speech engine finishes "reading" the email to the user, the interface device 116 can enter another audio menu. Such an audio menu can include a reply option, a forward option, or other options. If a user wishes to reply, the user can "scroll" until the user hears the word "reply." Once the user hears the word "reply" the user can depress the button 150 to enter a reply mode. As noted above, these types of commands can be issued using an AT command protocol, to which the source device will also be configured to respond. As noted above, one audio menu option can include voice command. For example, when a user chooses the voice command option, the interface electronic 116 can reconfigure to send an AT command to the source device, such as a cellular phone, to accept voice commands directly from the transceiver 114. Thus, as the user speaks, the audio signal is directed to the source device, which in turn is configured to issue audio indicators back to the user, through the speakers 14, 14A, 14B, 14C, 14D, 14E, 16, 16A, 16B, 16C, 16D, 16E, to guide the user through such a voice command.

For example, if a user chooses a voice command option, the user could issue commands such as, for example, but without limitation, "phonebook" or "call alpha." With a source device such as a cellular phone, that has a speech recognition engine and that is properly trained to recognize the voice of the user, the user can automatically enter the phonebook mode or directly call the phonebook listing "alpha," of course, as is apparent to one of ordinary skill in the art, such a voice command protocol could be used to issue other commands as well.

In another alternative, the interface electronics 116 can include a speech recognition engine and audio menus. In this alternative, the interface electronics 116 can recognize speech from the user, convert the speech to AT commands, and control this source device using a standard AT command protocol.

For example, but without limitation, the source device B can be in the form of a palm-top or hand-held computer known as a BLACKBERRY™. The presently marketed BLACKBERRY™ devices can communicate with a variety of wireless networks for receiving email, phone calls, and/or internet browsing. One aspect of at least one of the present inventions includes the realization that such a hand-held computer can include a text-to-speech engine. Thus, such a hand-held computer can be used in conjunction with any of the audio devices 10, 10A, 10A', 10B to allow a user to "hear" emails, or other text documents without the need to hold or look at the device B. Preferably, the hand-held computer includes a further wireless transceiver compatible with at least one of the transceivers 114, 114i. As such, a user can use any of the audio devices 10C, 10D, 10E to "hear" emails, or other text documents without the need to hold or look at the device B. Thus, a presently preferred hand-held computer, as a non-limiting example, includes a BLACKBERRY™ hand-held device including long range wireless network hardware for email and internet browsing capability, a BLUETOOTH™ transceiver for two-way short range audio and/or data audio communication, and a text-to-speech engine.

Preferably, the transceiver 114 is configured to transmit signals at about 100 mW. More preferably, the transceiver 114 is configured to transmit signals at no more than 100 mW. As such, the transceiver 114 uses less power. This is particularly advantageous because the power source 112 can be made smaller and thus lighter while providing a practicable duration of power between charges or replacement of the power source 112.

Of course, the foregoing description is that of a preferred construction having certain features, aspects and advantages in accordance with the present invention. Accordingly, various changes and modifications may be made to the above-described arrangements without departing from the spirit and scope of the invention, as defined by the appended claims.

What is claimed is:

1. An eyeglass frame, comprising:
   a support for supporting at least one lens in the path of a wearer's field of view;
   a first ear stem attached to the support, for extending in a posterior direction along a first side of the wearer's head;
   a second ear stem attached to the support, for extending in a posterior direction along a second side of the wearer's head;

at least one speaker supported by the first ear stem with a first mounting mechanism, the first mounting mechanism defining a linear path slang which the speaker can be translated by a user, the first mounting mechanism further defining a pivot configured to allow the speaker to be pivoted about a first pivot axis parallel to the linear path, wherein an electrical conduit extends from the speaker through at least a portion of the first mounting mechanism; and at least one microphone supported by at least one of the support, first ear stem, and second ear stem, the microphone being arranged to face towards the head of a wearer of the eyeglass frame.

2. An eyeglass frame as in claim 1, further comprising a power supply replaceably carried by the support.

3. An eyeglass frame as in claim 1, wherein the support comprises a pair of orbitals supporting the at least one lens and a second lens, respectively, a bridge connecting the orbitals, the microphone being supported by the bridge.

4. An eyeglass frame as in claim 1 additionally comprising a second speaker supported by the second ear stem with a second mounting mechanism, the second mounting mechanism being configured to define a second linear path along which a user can translate the second speaker, the second mounting mechanism being further configured to allow the second speaker to pivot about a second pivot axis parallel to the second linear path.

5. An eyeglass frame as in claim 1, wherein the mounting mechanism is configured to allow the first speaker to pivot about the first pivot axis over a range of at least about 30–40 degrees.

6. An eyeglass frame as in claim 1, wherein the mounting mechanism is configured to allow the first speaker to pivot about the first pivot axis over a range of at least about 90 degrees.

7. An eyeglass frame as in claim 1, wherein the mounting mechanism is configured to allow the first speaker to translate along the linear path over a range of at least about one-quarter of one inch.

8. An eyeglass frame as in claim 1, wherein the mounting mechanism is configured to allow the first speaker to translate along the linear path over a range of at least about three-quarters of one inch.

9. An eyeglass frame as in claim 1, wherein the electrical conduit comprises a wire.

10. An eyeglass frame as in claim 1, wherein the electrical conduit extends through an aperture in the first mounting mechanism.

11. An eyeglass frame as in claim 1, wherein the first mounting mechanism comprises a rod.

12. An eyeglass, comprising:
a frame configured to support a lens in the path of a wearer's field of view, the frame comprising:
at least one orbital; and
a first earphone support;
a telecommunications receiver positioned inside of the frame;
a telecommunications transmitter positioned inside of the frame;
a first earphone carried by the first earphone support, the earphone support being configured to define a linear path for the first earphone along which a user can translate the first earphone, the first earphone support being further configured to allow the first earphone to pivot about a first pivot axis parallel to the linear path, wherein an electrical conduit extends from the first earphone through at least a portion of the first earphone support; and
a microphone carried by the frame.

13. An eyeglass as in claim 12, further comprising a digital storage device.

14. An eyeglass as in claim 13, wherein the digital storage device comprises an MP3 storage device.

15. An eyeglass as in claim 12, further comprising a power supply carried by the frame.

16. An eyeglass as in claim 15, wherein the power supply is rechargeable.

17. An eyeglass as in claim 15, wherein the power supply is replaceably carried by the frame.

18. An eyeglass as in claim 12, wherein the frame further comprises a second earphone and a second earphone support and wherein the second earphone is carried by the second earphone support.

19. An eyeglass as in claim 18, wherein the first earphone support extends rearwardly from the front of the eyeglass and second earphone support extends rearwardly from the front of the eyeglass.

20. An eyeglass as in claim 18, wherein the first earphone support extends down from the frame and second earphone support extends down from the frame.

21. An eyeglass as in claim 12 additionally comprising a second earphone supported by a second earphone support, the second earphone support being configured to define a second linear path along which a user can translate the second earphone, the second earphone support being further configured to allow the second earphone to pivot about a second pivot axis parallel to the second linear path.

22. An eyeglass as in claim 12, wherein the earphone support is configured to allow the first earphone to pivot about the first pivot axis over a range of at least about 30–40 degrees.

23. An eyeglass as in claim 12, wherein the first earphone support is configured to allow the first earphone to pivot about the first pivot axis over a range of at least about 90 degrees.

24. An eyeglass as in claim 12, wherein the earphone support is configured to allow the first earphone to translate along the linear path over a range of at least about one-quarter of one inch.

25. An eyeglass as in claim 12, wherein the earphone support is configured to allow the first earphone to translate along the linear path over a range of at least about three-quarters of one inch.

26. An eyeglass as in claim 12, wherein the electrical conduit comprises a wire.

27. An eyeglass as in claim 12, wherein the electrical conduit extends through an aperture in the first mounting mechanism.

28. An eyeglass as in claim 12, wherein the first earphone support comprises a rod.

* * * * *

UNITED STATES PATENT AND TRADEMARK OFFICE
CERTIFICATE OF CORRECTION

| | | |
|---|---|---|
| PATENT NO. | : 7,150,526 B2 | Page 1 of 1 |
| APPLICATION NO. | : 10/628831 | |
| DATED | : December 19, 2006 | |
| INVENTOR(S) | : James Jannard et al. | |

It is certified that error appears in the above-identified patent and that said Letters Patent is hereby corrected as shown below:

On the Title page Item (56) Reference Cited, at column 1, under U.S. Patent Documents, line 2, please delete "Gamer" and insert -- Garner --, therefore.

At column 12, line 4, please delete "31" and insert -- 3I -- therefore.

At column 33, line 3, please delete "slang" and insert -- along --, therefore.

Signed and Sealed this

Twenty-ninth Day of May, 2007

JON W. DUDAS
*Director of the United States Patent and Trademark Office*